United States Patent
Nagai et al.

(10) Patent No.: US 7,105,269 B2
(45) Date of Patent: Sep. 12, 2006

(54) COPOLYMER, POLYMER MIXTURE, AND RADIATION-SENSITIVE RESIN COMPOSITION

(75) Inventors: Tomoki Nagai, Tokyo (JP); Daisuke Shimizu, Tokyo (JP); Tsutomu Shimokawa, Tokyo (JP); Fumihisa Miyajima, Tokyo (JP); Masaaki Miyaji, Tokyo (JP)

(73) Assignee: JSR Corporation, Tokyo (JP)

( * ) Notice: Subject to any disclaimer, the term of this patent is extended or adjusted under 35 U.S.C. 154(b) by 233 days.

(21) Appl. No.: 10/321,518

(22) Filed: Dec. 18, 2002

(65) Prior Publication Data

US 2003/0157423 A1    Aug. 21, 2003

(30) Foreign Application Priority Data

Dec. 20, 2001  (JP) ............................. 2001-387913
Nov. 13, 2002  (JP) ............................. 2002-329469

(51) Int. Cl.
*C03F 7/004*  (2006.01)
*C08L 29/00*  (2006.01)
*C08F 232/00* (2006.01)

(52) U.S. Cl. ................... 430/270.1; 430/905; 430/910; 525/216; 525/219; 526/308; 526/313

(58) Field of Classification Search ............... 430/170, 430/270.1, 905, 910; 526/308, 313, 346; 525/216, 219; 252/219

See application file for complete search history.

(56) References Cited

U.S. PATENT DOCUMENTS

| | | | | |
|---|---|---|---|---|
| 6,033,826 A | * | 3/2000 | Urano et al. | 430/270.1 |
| 6,156,477 A | * | 12/2000 | Motomi et al. | 430/270.1 |
| 6,338,931 B1 | * | 1/2002 | Maeda et al. | 430/170 |
| 6,432,608 B1 | * | 8/2002 | Fujie et al. | 430/270.1 |
| 6,461,789 B1 | * | 10/2002 | Hatakeyama et al. | 430/270.1 |
| 6,653,044 B1 | * | 11/2003 | Takeda et al. | 430/270.1 |
| 6,656,660 B1 | * | 12/2003 | Urano et al. | 430/270.1 |
| 2003/0118934 A1 | * | 6/2003 | Takeda et al. | 430/270.1 |

FOREIGN PATENT DOCUMENTS

| | | |
|---|---|---|
| JP | 227660 | 6/1990 |
| JP | 2000347405 | 1/2002 |

* cited by examiner

*Primary Examiner*—John S. Chu
(74) *Attorney, Agent, or Firm*—Merchant & Gould, P.C.; Steven B. Kelber

(57) ABSTRACT

1. A copolymer having recurring units of the following formulas (1), (2), and (3),

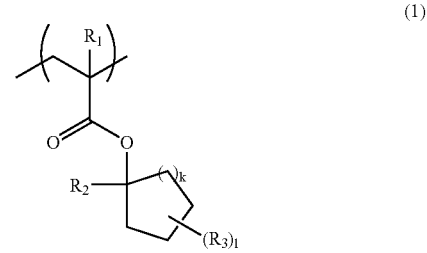

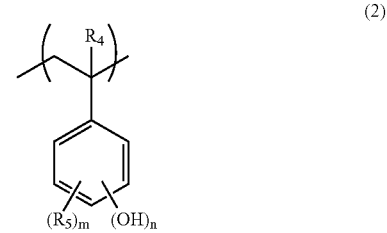

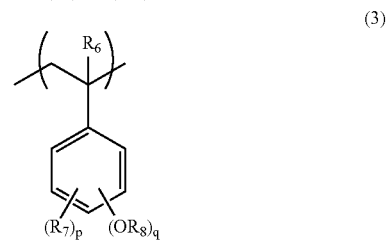

wherein $R_1$, $R_4$, $R_5$, and $R_6$ are a hydrogen atom or a methyl group, $R_2$, $R_3$, and $R_7$ represent a monovalent organic group, k is 1 or 2, l is 0–4, n is 1–3, m is 0–3, $R_8$ is a substituted methyl group, 1-substituted ethyl group, 1-branched alkyl group, triorganosilyl group, triorganogermyl group, alkoxycarbonyl group, acyl group, or cyclic acid-dissociable group, with two or more $R_8$ groups being the same or different, q is 1–3, and p is 0–3, the copolymer having a GPC average molecular weight of 3,000–100,000. The composition is useful as a polymer component for a radiation-sensitive resin composition suitable as a chemically-amplified resist.

16 Claims, 2 Drawing Sheets

COPOLYMER, POLYMER MIXTURE, AND RADIATION-SENSITIVE RESIN COMPOSITION

BACKGROUND OF THE INVENTION

1. Field of the Invention

The present invention relates to a radiation-sensitive resin composition and, more particularly, to a radiation-sensitive resin composition suitable as a chemically-amplified resist useful for microfabrication utilizing various types of radiation, for example, ultraviolet rays such as g-line or i-line, (extreme) deep ultraviolet rays such as a KrF excimer laser, ArF excimer laser, F2 excimer laser, or EUV, X-rays such as synchrotron radiation, and charged particle rays such as electron beams. The present invention also relates to a novel copolymer useful as a copolymer component for the resin composition and to a polymer mixture containing the copolymer.

2. Description of Background Art

In the field of microfabrication represented by fabrication of integrated circuit devices, photolithographic technology enabling microfabrication with a line width of 0.20 μm or less has been demanded in recent years in order to achieve a higher degree of integration.

A conventional photolithographic process utilizes near ultraviolet rays such as i-line radiation. It is known in the art that microfabrication with a line width of a sub-quarter micron order using near ultraviolet rays is very difficult.

Therefore, use of radiation with a shorter wavelength has been studied for enabling microfabrication with a line width of 0.20 μm or less. As radiation with a shorter wavelength, deep ultraviolet rays represented by a line spectrum of a mercury lamp and an excimer laser, X-rays, electron beams, and the like can be given. Of these, a KrF excimer laser (wavelength: 248 nm), an ArF excimer laser (wavelength: 193 nm), an F2 excimer laser (wavelength: 157 nm), and EUV (wavelength: 13 nm, etc., extreme ultraviolet radiation) have attracted attention.

As a radiation-sensitive resin composition applicable to shorter wavelength radiation, a number of compositions utilizing a chemical amplification effect between a component having an acid-dissociable functional group and a photoacid generator which generates an acid upon irradiation (hereinafter called "exposure") has been proposed. Such a composition is hereinafter called a chemically-amplified radiation-sensitive composition.

As the chemically-amplified radiation-sensitive composition, Japanese Patent Publication No. 27660/1990 discloses a composition comprising a resin containing a t-butyl ester group of carboxylic acid or a t-butylcarbonate group of phenol and a photoacid generator. This composition utilizes the effect of the resin to release a t-butyl ester group or t-butyl carbonate group by the action of an acid generated upon exposure to form an acidic group such as a carboxylic group or a phenolic hydroxyl group, which renders an exposed area on a resist film readily soluble in an alkaline developer.

Micronization of photolithography processes in recent years has been remarkable. In particular, in the KrF photolithography processes the limit resolution has decreased to one half of the light source wavelength or less. For this reason, characteristics required for photo resists have become increasingly stringent. In particular, there is urgent need for the improvement in the resolution performance, radiation transmittance, and dry etching resistance. As factors affecting the resolution of chemically-amplified resists, an activation energy required for dissociation of protection groups in an acid-dissociable resin,; difference in the dissolution rate in the developer before and after the dissociation, and the like can be given. From the viewpoint of the dissolution rate, an acrylic acid/phenol hybrid type (or an ESCAP-type) represented by protection of carboxylic acid with a t-butyl group is more advantageous than a pure phenol resin represented by protection of phenol with a t-butyl carbonate group. From the viewpoint of the activation energy, resins containing many alkyl-substituents having a large steric hindrance and acting as an electron donor are more preferable. For these reasons, Japanese Patent Application Laid-open No. 347405/2000 discloses a photo resist using an acrylic acid ester having a cycloalkyl group as a protection group. The composition disclosed by this patent application contains styrene units introduced to compensate poor dry etching resistance of the acrylic acid ester, with a consequence of sacrificing the advantage of superior resolution.

An object of the present invention is to provide a radiation-sensitive resin composition useful as a chemically amplified resist sensible to active radiations, for example, deep ultraviolet rays represented by a KrF excimer laser, ArF excimer laser, F2 excimer laser, and EUV excimer laser, exhibiting high resolution and high radiation transmittance, without impairing dry etching resistance.

Another object of the present invention is to provide a copolymer and a polymer mixture useful as a polymer component for the radiation-sensitive resin composition.

SUMMARY OF THE INVENTION

The above object can be solved in the present invention by copolymer having recurring units of the following formulas (1), (2), and (3),

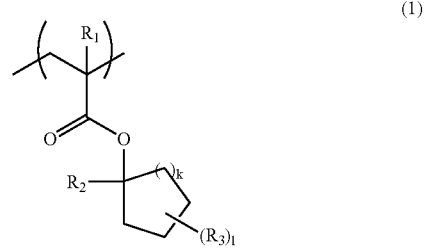

(1)

wherein $R_1$ represents a hydrogen atom or a methyl group, $R_2$ and $R_3$ individually represent a monovalent organic group, k is an integer of 1 or 2, and 1 is an integer of 0 to 4,

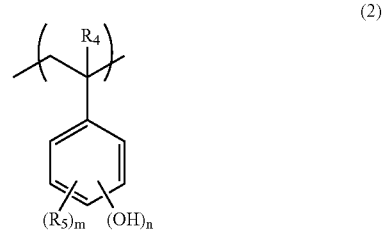

(2)

wherein $R_4$ represents a hydrogen atom or a methyl group, $R_5$ represents a monovalent organic group, n is an integer of 1 to 3, and m is an integer of 0 to 3, and

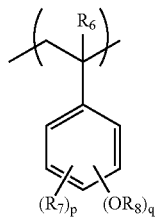

(3)

wherein $R_6$ represents a hydrogen atom or a methyl group, $R_7$ represents a monovalent organic group, $R_8$ indicates a substituted methyl group, 1-substituted ethyl group, 1-branched alkyl group, triorganosilyl group, triorganogermyl group, alkoxycarbonyl group, acyl group, or cyclic acid-decomposable group, with two or more $R_8$ groups being either the same or different, q is an integer of 1 to 3, and p is an integer of 0 to 3.

In a preferred embodiment of the present invention, $R_8$ in the formula (2) is at least one group selected from the group consisting of a t-butyl group, benzyl group, 1-methoxyethyl group, 1-ethoxyethyl group, trimethylsilyl group, t-butoxycarbonyl group, t-butoxycarbonylmethyl group, tetrahydropyranyl group, tetrahydrofuranyl group, tetrahydrothiopyranyl group, tetrahydrothiofuranyl group, and 2-methyl-2-adamantyl group.

The above object can also be achieved in the present invention by a polymer mixture comprising (a1) a copolymer having the recurring units of the above formulas (1) and (2) and (a2) a copolymer having the recurring units of the above formulas (2) and (3).

In a preferred embodiment of the present invention, the copolymer (a1) further contains the recurring unit of the above (3).

In a further preferred embodiment of the present invention, the above copolymer (a1) or copolymer (a2) further contains a recurring unit derived from a non-acid-dissociable hydrophobic compound.

In a still further preferred embodiment of the present invention, the above non-acid-dissociable hydrophobic compound is styrene, α-methylstyrene, 4-methylstyrene, 2-methylstyrene, 3-methylstyrene, or tricyclodecanyl acrylate.

In a still further preferred embodiment of the above polymer mixture, the above group $R_8$ in the formula (2) is at least one group selected from the group consisting of a t-butyl group, benzyl group, 1-methoxyethyl group, 1-ethoxyethyl group, trimethylsilyl group, t-butoxycarbonyl group, t-butoxycarbonylmethyl group, tetrahydropyranyl group, tetrahydrofuranyl group, tetrahydrothiopyranyl group, tetrahydrothiofuranyl group, and 2-methyl-2-adamantyl group.

The above object can also be achieved in the present invention by a radiation-sensitive resin composition comprising (A) a polymer component which comprises the recurring units of the above formulas (1), (2), and (3) and (B) a photoacid generator.

In a preferred embodiment of the above radiation-sensitive resin composition, the polymer component (A) is the above-described copolymer.

In another preferred embodiment of the above radiation-sensitive resin composition, the polymer component (A) is the above-described polymer mixture.

Other objects, features and advantages of the invention will hereinafter become more readily apparent from the following description.

DETAILED DESCRIPTION OF THE INVENTION AND PREFERRED EMBODIMENT

Figure 1:
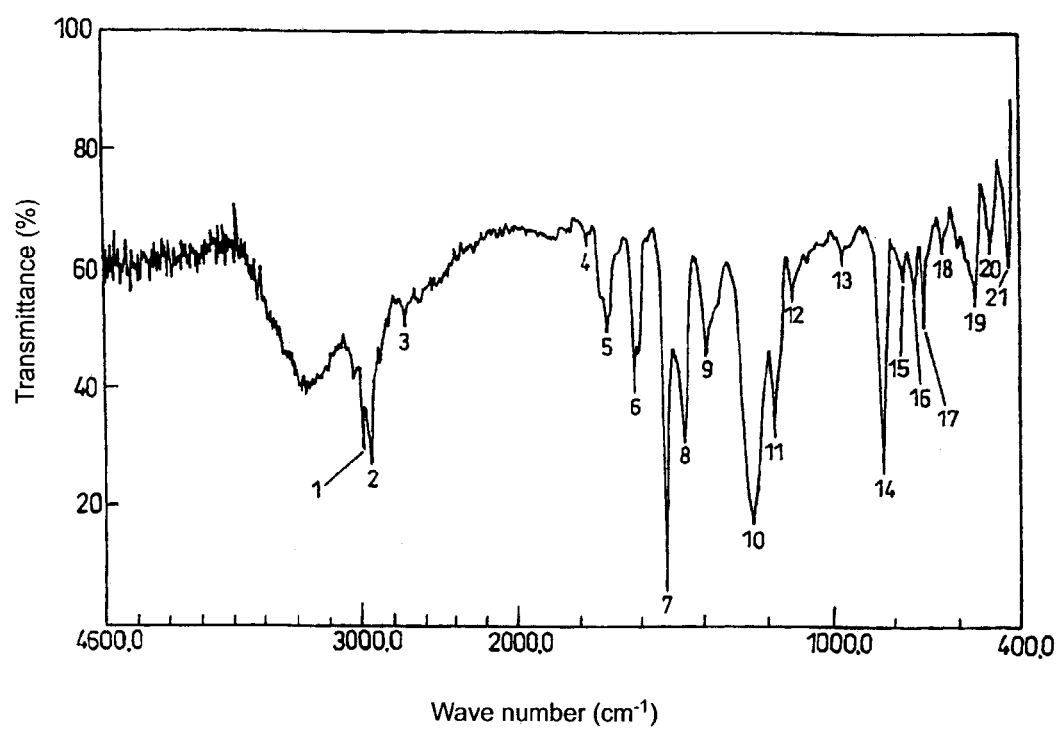
FIG. 1 is an IR absorption spectrum of the polymer (a-viii) obtained in Synthesis Example 8.

The present invention will now be described in more detail primarily by way of embodiments of the radiation-sensitive resin composition.

(A) Polymer Component

The polymer component used as the component (A) (hereinafter referred to as "polymer component (A)") must contain the recurring unit of the above formula (1) (hereinafter referred to as "recurring unit (1)"), the recurring unit of the above formula (2) (hereinafter referred to as "recurring unit (2)"), and the recurring unit of the above formula (3) (hereinafter referred to as "recurring unit (3)"). There are no specific limitations to the form in which these recurring units are included. A mixture of three type of polymers, each containing one of these recurring units, a copolymer containing the above three recurring units, a mixture of two or more polymers, each containing a combination of two different recurring units among the three recurring units, and a mixture of any optional combination of these polymers can be given.

Specifically, the following two types of polymer component (A) can be given.

The first type of polymer component (A) contains a copolymer having the recurring unit (1), recurring unit (2), and recurring unit (3).

The second type is a mixture of two or more polymers, each comprising one or two recurring units selected from the recurring unit (1), recurring unit (2), and recurring unit (3). The second type of copolymer component (A) may contain the first type of polymer component (A).

A typical embodiment of the second type of polymer component (A) is a polymer mixture comprising (a1) a copolymer having the recurring unit (1) and the recurring unit (2) and (a2) a copolymer having the recurring unit (2) and the recurring unit (3). In this instance, the copolymer of the component (a1) may further contain the recurring unit (3) or the copolymer of the component (a2) may further contain the recurring unit (1).

Due to the possession of a substituted cycloalkyl group, which is bulky and having comparatively low dissociation activation energy, as an acid dissociable protective group in the recurring unit (1), the polymer component (A) of the present invention produces acrylic acid units having higher acidity than phenolic hydroxyl groups when dissociated with an acid, thereby more effectively accelerating the dissolution speed of the resist in the developers. In addition, since the recurring unit (3) exhibits greater contribution to dry etching resistance than the recurring unit (1), the resist possesses high resolution, high transparency, and superior dry etching resistance at the same time.

As examples of the monovalent organic group represented by $R_2$ in the formula (1), linear or branched alkyl groups having 1–12 carbon atoms such as a methyl group, ethyl group, n-propyl group, i-propyl group, n-butyl group, 2-methylpropyl group, 1-methylpropyl group, and t-butyl group; linear or branched alkoxyl groups having 1–12 carbon atoms such as a methoxy group, ethoxy group, n-propoxy group, i-propoxy group, n-butoxy group, 2-methylpropoxy group, 1-methylpropoxy group, and t-butoxy group; and the like can be given.

The groups given as examples of the group $R_2$ can be given as examples of the group $R_3$ in the formula (1), the group $R_5$ in the formula (2), and the group $R_7$ in the formula (3) Methyl group, ethyl group, n-butyl group, and t-butyl group are preferable in all cases.

The group $R_8$ in the formula (3) is an acid-dissociable group and includes a substituted methyl group, 1-substituted ethyl group, 1-branched alkyl group, triorganosilyl group, triorganogermyl group, alkoxy carbonyl group, acyl group, and cyclic acid-dissociable group. When two or more $R_8$ groups are present, these $R_8$ groups may be either the same or different.

As examples of the substituted methyl groups, a methoxymethyl group, methylthiomethyl group, ethoxymethyl group, ethylthiomethyl group, methoxyethoxymethyl group, benzyloxymethyl group, benzylthiomethyl group, phenacyl group, bromophenacyl group, methoxyphenacyl group, methylthiophenacyl group, α-methylphenacyl group, cyclopropylmethyl group, benzyl group, diphenylmethyl group, triphenylmethyl group, bromobenzyl group, nitrobenzyl group, methoxybenzyl group, methylthiobenzyl group, ethoxybenzyl group, ethylthiobenzyl group, piperonyl group, methoxycarbonylmethyl group, ethoxycarbonylmethyl group, n-propoxycarbonylmethyl group, i-propoxycarbonylmethyl group, n-butoxycarbonylmethyl group, t-butoxycarbonylmethyl group, and adamantylmethyl group can be given.

As examples of the 1-substituted ethyl groups, a 1-methoxyethyl group, 1-methylthioethyl group, 1,1-dimethoxyethyl group, 1-ethoxyethyl group, 1-ethylthioethyl group, 1,1-diethoxyethyl group, 1-ethoxypropyl group, 1-propoxyethyl group, 1-cyclohexyloxyethyl group, 1-phenoxyethyl group, 1-phenylthioethyl group, 1,1-diphenoxyethyl group, 1-benzyloxyethyl group, 1-benzylthioethyl group, 1-cyclopropylethyl group, 1-phenylethyl group, 1,1-diphenylethyl group, 1-methoxycarbonylethyl group, 1-ethoxycarbonylethyl group, 1-n-propoxycarbonylethyl group, 1-1-propoxycarbonylethyl group, 1-n-butoxycarbonylethyl group, and 1-t-butoxycarbonylethyl group can be given.

As examples of the 1-branched alkyl groups, an i-propyl group, sec-butyl group, t-butyl group, 1,1-dimethylpropyl group, 1-methylbutyl group, 1,1-dimethylbutyl group, and the like can be given.

As examples of the triorganosilyl groups, tricarbylsilyl groups such as a trimethylsilyl group, ethyldimethylsilyl group, methyldiethylsilyl group, triethylsilyl group, i-propyldimethylsilyl group, methyldi-i-propylsilyl group, tri-i-propylsilyl group, t-butyldimethylsilyl group, methyldi-t-butylsilyl group, tri-t-butylsilyl group, phenyldimethylsilyl group, methyldiphenylsilyl group, and triphenylsilyl group can be given.

As examples of the triorganogermyl groups, tricarbylgermyl groups such as a trimethylgermyl group, ethyldimethylgermyl group, methyldiethylgermyl group, triethylgermyl group, i-propyldimethylgermyl group, methyldi-i-propylgermyl group, tri-i-propylgermyl group, t-butyldimethylgermyl group, methyldi-t-butylgermyl group, tri-t-butylgermyl group, phenyldimethylgermyl group, methyldiphenylgermyl group, and triphenylgermyl group can be given.

As examples of the alkoxycarbonyl groups, a methoxycarbonyl group, ethoxycarbonyl group, i-propoxycarbonyl group, t-butoxycarbonyl group, and the like can be given.

As examples of the acyl groups, an acetyl group, propionyl group, butyryl group, heptanoyl group, hexanoyl group, valeryl group, pivaloyl group, isovaleryl group, lauloyl group, myristoyl group, palmitoyl group, stearoyl group, oxalyl group, malonyl group, scucinyl group, glutaryl group, adipoyl group, piperoyl group, suberoyl group, azelaoyl group, sebacoyl group, acryloyl group, propioloyl group, methacryloyl group, crotonoyl group, oleoyl group, maleoyl group, fumaroyl group, mesaconoyl group, campholoyl group, benzoyl group, phthaloyl group, isophthaloyl group, terephthaloyl group, naphthoyl group, toluoyl group, hydroatropoyl group, atropoyl group, cinnamoyl group, furoyl group, thenoyl group, nicotinoyl group, isonicotinoyl group, p-toluenesulfonyl group, mesyl group, and the like can be given.

As examples of the above cyclic acid-dissociable groups, a cyclopropyl group, cyclopentyl group, 1-methylcyclopentyl group, 1-ethylcyclopentyl group, cyclohexyl group, 1-methylcyclohexyl group, 1-ethylcyclohexyl group, 4-methoxycyclohexyl group, cyclohexenyl group, tetrahydropyranyl group, tetrahydrofuranyl group, tetrahydrothiopyranyl group, tetrahydrothiofuranyl group, 3-bromotetrahydropyranyl group, 4-methoxytetrahydropyranyl group, 4-methoxytetrahydrothiopyranyl group, 3-tetrahydrothiophene-1,1-dioxide group, norbornyl group, methylnorbornyl group, ethylnorbornyl group, isobornyl group, tricyclodecanyl group, dicyclopentenyl group, adamantyl group, 2-methyl-2-adamantyl group, and 2-ethyl-2-adamantyl group can be given.

Of these monovalent acid-dissociable groups, a t-butyl group, benzyl group, 1-methoxyethyl group, 1-ethoxyethyl group, trimethylsilyl group, t-butoxycarbonyl group, t-butoxycarbonylmethyl group, tetrahydropyranyl group, tetrahydrofuranyl group, tetrahydrothiopyranyl group, tetrahydrothiofuranyl group, 2-methyl-2-adamantyl group, and the like are preferable.

The polymer component (A) of the present invention may further comprise a recurring unit originating from a non-acid-dissociable hydrophobic compound (hereinafter referred to as a "structural unit (4)" from time to time). As examples of the non-acid-dissociable hydrophobic compounds, styrene, α-methylstyrene, 4-methylstyrene, 2-methylstyrene, 3-methylstyrene, isobornyl acrylate, tricyclodecanyl (meth)acrylate, tetracyclododecenyl (meth)acrylate, and the like can be given. Of these, styrene, α-methylstyrene, 4-methylstyrene, 2-methylstyrene, 3-methylstyrene, and tricyclodecanyl acrylate are preferable.

The amount of the recurring unit (1) in the polymer component (A) is usually 1–50 mol %, preferably 1–40 mol %, and more preferably 5–30 mol %. If the content of the recurring unit (1) is too small, sensitivity and resolution of the resulting composition may be insufficient. If the content is too large, the dry etching resistance may be insufficient.

The amount of the recurring unit (2) is usually 20—90 mol %, preferably 30–90 mol %, and more preferably 50–90 mol %. If the content of the recurring unit (2) is too small, adhesion properties of the formed resist coating to the substrate may be poor. If the content is too large, contrast of the resist coating after development may be insufficient.

The amount of the recurring unit (3) is usually 1–50 mol %, preferably 1–40 mol %, and more preferably 5–30 mol %. If the content of the recurring unit (3) is too small, the dry etching resistance of the formed resist coating may be insufficient. If the content is too large, adhesion properties of the resist coating to the substrate may be poor.

The amount of the structural unit (4) is usually determined from the range of 0–20 mol %, taking the balance of the resolution performance and dry etching resistance into consideration.

Synthesis of Polymers:

The methods for synthesizing various polymers making up the polymer component (A) include, but are not limited to, the following methods ①–④, for example.

① A method of obtaining a copolymer having the recurring unit (2) and the recurring units (1) and/or (3) by polymerizing at least one monomer selected from the group consisting of alkyl cycloalkyl (meth)acrylates (monomers composing the recurring unit (1)) and styrene derivatives substituted with an acid-dissociable group (monomers composing the recurring unit (3)) with acetoxystyrene by known radical polymerization or anionic polymerization and hydrolyzing the resulting copolymer in an organic solvent in the presence of a base or an acid.

② A method of obtaining a (co)polymer having at least one recurring unit selected from the group consisting of the recurring unit (1), recurring unit (2), and recurring unit (3) by polymerizing at least one monomer selected from the group consisting of alkyl cycloalkyl (meth)acrylates (monomers composing the recurring unit (1)), vinyl phenol or α-methyl vinyl phenol (monomer composing the recurring unit (2)), and styrene derivatives substituted with an acid-dissociable group (monomers composing the recurring unit (3)) by known radical polymerization or anionic polymerization.

③ A method of obtaining a copolymer having the recurring unit (2) and recurring unit (3) by polymerizing a styrene derivative substituted with an acid-dissociable group such as t-butoxystyrene or the like by known radical polymerization or anionic polymerization, hydrolyzing in the same manner as in ① above during or after the polymerization to obtain poly(p-hydroxystyrene), and reacting the resulting polymer with a protective agent for hydroxy groups such as ethyl vinyl ether in an organic solvent in the presence of an acid or a base.

④ A method of obtaining a polymer having the recurring unit (2) or a copolymer having the recurring unit (2) and recurring unit (3) by polymerizing a styrene derivative substituted with an acid-dissociable group such as t-butoxystyrene or the like by known radical polymerization or anionic polymerization and hydrolyzing the polymer in the same manner as in ① above to convert a part or all of the acid-dissociable groups into hydroxy groups.

The radical polymerization can be carried out as follows, for example. A mixture of the above monomers and other monomers, as required, in a suitable organic solvent is stirred under a nitrogen atmosphere in the presence of a radical polymerization initiator while heating at 50–200° C., for example. As examples of radical polymerization initiators, azo compounds such as 2,2'-azobisisobutylonitrile, 2,2'-azobis-(2,4-dimethylvaleronitrile), 2,2'-azobis-(4-methoxy-2,4-dimethylvaleronitrile), 2,2'-azobismethylbutyronitrile, 2,2'-azobiscyclohexanecarbonitrile, cyanomethylethylazoformamide, 2,2'-azobis(2,4-dimethylmethylpropionate), and 2,2'-azobiscyanovaleric acid; organicperoxide such as benzoyl peroxide, lauroyl peroxide, 1,1'-bis-(t-butylperoxy) cyclohexane, 3,5,5-trimethylhexanoyl peroxide, and t-butylperoxy-2-ethylhexanoate, and hydrogen peroxide can be given. In addition, 2,2,6,6-tetramethyl-1-piperidinyloxy, iodine, mercaptan, styrene dimmer, and the like may be added as a polymerization assisting agent.

The anionic polymerization can be carried out as follows, for example. The monomers are stirred in a suitable organic solvent in the presence of an anionic polymerization initiator under a nitrogen atmosphere while heating at −100° C. to 50° C., for example. As an anionic polymerization initiator, an organic alkali metal such as n-butyl lithium, s-butyl lithium, t-butyl lithium, ethyl lithium, ethyl sodium, 1,1-diphenylhexyl lithium, 1,1-diphenyl-3-methylpentyl lithium, or the like can be used.

The above polymers may also be synthesized by polymerizing monomers with heating without using a polymerization initiator or by means of cationic polymerization.

As examples of the acid used for the above hydrolysis reaction or the reaction with a protective group agent, organic acids such as p-toluenesulfonic acid and its hydrate, methanesulfonic acid, trifluoromethanesulfonic acid, malonic acid, oxalic acid, and 1,1,1-fluoroacetic acid; inorganic acids such as sulfuric acid, hydrochloric acid, phosphoric acid, and hydrobromic acid; and salts such as pyridinium p-toluenesulfonate, ammonium p-toluenesulfonate, and 4-methylpyridinium p-toluenesulfonate can be given.

As examples of the base, inorganic bases such as potassium hydroxide, sodium hydroxide, sodium carbonate, and potassium carbonate; organic bases such as triethylamine, N-methyl-2-pyrrolidone, piperidine, and tetramethyl ammonium hydroxide; and the like can be given.

The following solvents are given as examples of organic solvent suitably used in the above polymerization and hydrolysis: ketones such as acetone, methyl ethyl ketone, and methyl amyl ketone; ethers such as diethyl ether and tetrahydrofuran (THF); alcohols such as methanol, ethanol, and propanol; aliphatic hydrocarbons such as hexane, heptane, and octane; aromatic hydrocarbons such as benzene, toluene, and xylene; alkyl halides such as chloroform, bromoform, methylene chloride, methylene bromide, and carbon tetrachloride; esters such as ethyl acetate, butyl acetate, ethyl lactate, propylene glycol monomethyl ether, propylene glycol monomethyl ether acetate, and cellosolves; non-protonic polar solvents such as dimethylformamide, dimethylsulfoxide, and hexamethylphosphoroamide; and the like. Of these, acetone, methyl amyl ketone, methyl ethyl ketone, tetrahydrofuran, methanol, ethanol, propanol, ethyl acetate, butyl acetate, ethyl lactate, propylene glycol monomethyl ether, propylene glycol monomethyl ether acetate are preferable.

The polymerization reaction temperature varies according to the type of the initiator used. When an alkyl lithium is used in the above anionic polymerization, the temperature is preferably from −100° C. to 50° C., and more preferably from −78° C. to 30° C. When an azo initiator or a peroxide initiator is used in the radical polymerization, a temperature that brings the half-life of the initiator to a range preferably from about 10 minutes to 30 hours, more preferably from about 30 minutes to 10 hours, is applicable.

Although the reaction time differs according to the type of the initiator and reaction temperature, a period of time during which a 50% or greater amount of initiator is consumed, about 0.5–24 hours in many cases, is preferable.

The polystyrene-reduced weight average molecular weight (hereinafter referred to as "Mw") of the copolymer component (A) determined by gel permeation chromatography (hereinafter referred to as "GPC") is preferably 3,000–100,000, more preferably 5,000–60,000, and particularly preferably 8,000–40,000. The ratio (Mw/Mn) of Mw to the polystyrene-reduced number average molecular weight (hereinafter referred to as "Mn") determined by GPC is usually 1–5.

(B) Photoacid Generator

The component (B) of the present invention is a photoacid generator which generates an acid upon exposure (hereinafter referred to as "acid generator (B)").

As examples of the acid generator (B), (1) onium salt compounds, (2) sulfone compounds, (3) sulfonate compounds, (4) sulfonimide compounds, (5) diazomethane compounds, and (6) disulfonylmethane compounds can be given. Of these compounds, sulfonimide compounds and disulfonylmethane compounds are preferable.

Examples of these acid generators (B) are as follows:

(1) Onium Salt Compounds:

As examples of onium salts, iodonium salts, sulfonium salts (including tetrahydrothiophenium salts), phosphonium salts, diazonium salts, ammonium salt, pyridinium salts, and the like can be given.

Specific examples of onium salts include:
bis(4-t-butylphenyl)iodonium trifluoromethanesulfonate,
bis(4-t-butylphenyl)iodonium nonafluoro-n-butanesulfonate,
bis(4-t-butylphenyl)iodonium pyrenesulfonate,
bis(4-t-butylphenyl)iodonium n-dodecylbenzenesulfonate,
bis(4-t-butylphenyl)iodonium p-toluenesulfonate,
bis(4-t-butylphenyl)iodonium benzenesulfonate,
bis(4-t-butylphenyl)iodonium 10-camphorsulfonate,
bis(4-t-butylphenyl)iodonium n-octanesulfonate,
bis(4-t-butylphenyl)iodonium perfluoro-n-octanesulfonate,
bis(4-t-butylphenyl)iodonium 2-trifluoromethylbenzenesulfonate,
bis(4-t-butylphenyl)iodonium 4-trifluoromethylbenzenesulfonate,
bis(4-t-butylphenyl)iodonium 2,4-difluorobenzenesulfonate,
diphenyliodonium trifluoromethanesulfonate,
diphenyliodonium nonafluoro-n-butanesulfonate,
diphenyliodonium pyrenesulfonate,
diphenyliodonium n-dodecylbenzenesulfonate,
diphenyliodonium p-toluenesulfonate,
diphenyliodonium benzenesulfonate,
diphenyliodonium 10-camphorsulfonate,
diphenyliodonium n-octanesulfonate,
diphenyliodonium perfluoro-n-octanesulfonate,
diphenyliodonium 2-trifluoromethylbenzenesulfonate,
diphenyliodonium 4-trifluoromethylbenzenesulfonate,
diphenyliodonium 2,4-difluorobenzenesulfonate,
triphenylsulfonium trifluoromethanesulfonate,
triphenylsulfonium nonafluoro-n-butanesulfonate,
triphenylsulfonium pyrenesulfonate,
triphenylsulfonium n-dodecylbenzenesulfonate,
triphenylsulfonium p-toluenesulfonate,
triphenylsulfonium benzenesulfonate,
triphenylsulfonium 10-camphorsulfonate,
triphenylsulfonium n-octanesulfonate,
triphenylsulfonium perfluoro-n-octanesulfonate,
triphenylsulfonium 2-trifluoromethylbenzenesulfonate,
triphenylsulfonium 4-trifluorobenzenesulfonate,
triphenylsulfonium 2,4-difluorobenzenesulfonate,
triphenylsulfonium hexafluoroantimonate,
triphenylsulfonium 1-naphthalenesulfonate,
4-t-butylphenyl.diphenylsulfonium trifluoromethanesulfonate,
4-t-butylphenyl.diphenylsulfonium nonafluoro-n-butanesulfonate,
4-t-butylphenyl.diphenylsulfonium pyrenesulfonate,
4-t-butylphenyl.diphenylsulfonium n-dodecylbenzenesulfonate,
4-t-butylphenyl.diphenylsulfonium p-toluenesulfonate,
4-t-butylphenyl.diphenylsulfonium benzenesulfonate,
4-t-butylphenyl.diphenylsulfonium 10-camphorsulfonate,
4-t-butylphenyl.diphenylsulfonium n-octanesulfonate,
4-t-butylphenyl.diphenylsulfonium 2-trifluoromethylbenzenesulfonate,
4-t-butylphenyl.diphenylsulfonium 4-trifluoromethylbenzenesulfonate,
4-t-butylphenyl.diphenylsulfonium 2,4-difluorobenzenesulfonate,
4-t-butoxyphenyl.diphenylsulfonium nonafluoro-n-butanesulfonate,
4-hydroxyphenyl.benzyl.methylsulfonium p-toluenesulfonate,
cyclohexyl.2-oxocyclohexyl-methylsulfonium trifluoromethanesulfonate,
dicyclohexyl.2-oxocyclohexylsulfonium trifluoromethanesulfonate,
2-oxocyclohexyldimethylsulfonium trifluoromethanesulfonate,
1-naphthyldimethylsulfonium trifluoromethanesulfonate,
1-naphthyldiethylsulfonium trifluoromethanesulfonate,
4-cyano-1-naphthyldimethylsulfonium trifluoromethanesulfonate,
4-nitro-1-naphthyldimethylsulfonium trifluoromethanesulfonate,
4-methyl-1-naphthyldimethylsulfonium trifluoromethanesulfonate,
4-cyano-1-naphthyldiethylsulfonium trifluoromethanesulfonate,
4-nitro-1-naphthyldiethylsulfonium trifluoromethanesulfonate,
4-methyl-1-naphthyldiethylsulfonium trifluoromethanesulfonate,
4-hydroxy-1-naphthyldimethylsulfonium trifluoromethanesulfonate,
1-(4-hydroxynaphthyl)tetrahydrothiophenium trifluoromethanesulfonate,
1-(4-hydroxynaphthyl)tetrahydrothiophenium nonafluoro-n-butanesulfonate,
1-(4-hydroxynaphthyl)tetrahydrothiophenium perfluoro-n-octanesulfonate,
1-(4-methoxynaphthyl)tetrahydrothiophenium trifluoromethanesulfonate,
1-(4-methoxynaphthyl)tetrahydrothiophenium nonafluoro-n-butanesulfonate,
1-(4-methoxynaphthyl)tetrahydrothiophenium perfluoro-n-octanesulfonate,
1-(4-ethoxynaphthyl)tetrahydrothiophenium trifluoromethanesulfonate,
1-(4-ethoxynaphthyl)tetrahydrothiophenium nonafluoro-n-butanesulfonate,
1-(4-ethoxynaphthyl)tetrahydrothiophenium perfluoro-n-octanesulfonate,
1-(4-n-butoxynaphthyl)tetrahydrothiophenium trifluoromethanesulfonate,
1-(4-n-butoxynaphthyl)tetrahydrothiophenium nonafluoro-n-butanesulfonate,
1-(4-n-butoxynaphthyl)tetrahydrothiophenium perfluoro-n-octanesulfonate,
1-(4-methoxymethoxynaphthyl)tetrahydrothiophenium trifluoromethanesulfonate, 1-(4-methoxymethoxynaphthyl)tetrahydrothiophenium nonafluoro-n-butanesulfonate,
1-(4-methoxymethoxynaphthyl)tetrahydrothiophenium perfluoro-n-octanesulfonate,
1-(4-ethoxymethoxynaphthyl)tetrahydrothiophenium trifluoromethanesulfonate,
1-(4-ethoxymethoxynaphthyl)tetrahydrothiophenium nonafluoro-n-butanesulfonate,
1-(4-ethoxymethoxynaphthyl)tetrahydrothiophenium perfluoro-n-octanesulfonate,
1-{4-(1-methoxyethoxy)naphthyl}tetrahydrothiophenium trifluoromethanesulfonate,
1-{4-(1-methoxyethoxy)naphthyl}tetrahydrothiophenium nonafluoro-n-butanesulfonate,
1-{4-(1-methoxyethoxy)naphthyl}tetrahydrothiophenium perfluoro-n-octanesulfonate,
1-{4-(2-methoxyethoxy)naphthyl}tetrahydrothiophenium trifluoromethanesulfonate,
1-{4-(2-methoxyethoxy)naphthyl}tetrahydrothiophenium nonafluoro-n-butanesulfonate,
1-{4-(2-methoxyethoxy)naphthyl}tetrahydrothiophenium perfluoro-n-octanesulfonate,
1-(4-methoxycarbonyloxynaphthyl)tetrahydrothiophenium trifluoromethanesulfonate,
1-(4-methoxycarbonyloxynaphthyl)tetrahydrothiophenium nonafluoro-n-butanesulfonate,
1-(4-methoxycarbonyloxynaphthyl)tetrahydrothiophenium perfluoro-n-octanesulfonate,
1-(4-ethoxycarbonyloxynaphthyl)tetrahydrothiophenium trifluoromethanesulfonate,
1-(4-ethoxycarbonyloxynaphthyl)tetrahydrothiophenium nonafluoro-n-butanesulfonate,
1-(4-ethoxycarbonyloxynaphthyl)tetrahydrothiophenium perfluoro-n-octanesulfonate,
1-(4-n-propoxycarbonyloxynaphthyl)tetrahydrothiophenium trifluoromethanesulfonate,
1-(4-n-propoxycarbonyloxynaphthyl)tetrahydrothiophenium nonafluoro-n-butanesulfonate,
1-(4-n-propoxycarbonyloxynaphthyl)tetrahydrothiophenium perfluoro-n-octanesulfonate,
1-(4-i-propoxycarbonyloxynaphthyl)tetrahydrothiophenium trifluoromethanesulfonate,
1-(4-i-propoxycarbonyloxynaphthyl)tetrahydrothiophenium nonafluoro-n-butanesulfonate,
1-(4-i-propoxycarbonyloxynaphthyl)tetrahydrothiophenium perfluoro-n-octanesulfonate,
1-(4-n-butoxycarbonyloxynaphthyl)tetrahydrothiophenium trifluoromethanesulfonate,
1-(4-n-butoxycarbonyloxynaphthyl)tetrahydrothiophenium nonafluoro-n-butanesulfonate,
1-(4-n-butoxycarbonyloxynaphthyl)tetrahydrothiophenium perfluoro-n-octanesulfonate,
1-(4-t-butoxycarbonyloxynaphthyl)tetrahydrothiophenium trifluoromethanesulfonate,
1-(4-t-butoxycarbonyloxynaphthyl)tetrahydrothiophenium nonafluoro-n-butanesulfonate,
1-(4-butoxycarbonyloxynaphthyl)tetrahydrothiophenium perfluoro-n-octanesulfonate,
1-{4-(2-tetrahydrofuranyloxy)naphthyl}tetrahydrothiophenium trifluoromethanesulfonate,
1-{4-(2-tetrahydrofuranyloxy)naphthyl}tetrahydrothiophenium nonafluoro-n-butanesulfonate,
1-{4-(2-tetrahydrofuranyloxy)naphthyl}tetrahydrothiophenium perfluoro-n-octanesulfonate,
1-{4-(2-tetrahydropyranyloxy)naphthyl}tetrahydrothiophenium trifluoromethanesulfonate,
1-{4-(2-tetrahydropyranyloxy)naphthyl}tetrahydrothiophenium nonafluoro-n-butanesulfonate,
1-{4-(2-tetrahydropyranyloxy)naphthyl}tetrahydrothiophenium perfluoro-n-octanesulfonate,
1-(4-benzyloxynaphthyl)tetrahydrothiophenium -trifluoromethanesulfonate,
1-(4-benzyloxynaphthyl)tetrahydrothiophenium nonafluoro-n-butanesulfonate,
1-(4-benzyloxynaphthyl)tetrahydrothiophenium perfluoro-n-octanesulfonate,
1-(1-naphthylacetomethyl)tetrahydrothiophenium trifluoromethanesulfonate,
1-(1-naphthylacetomethyl)tetrahydrothiophenium nonafluoro-n-butanesulfonate,
1-(1-naphthylacetomethyl)tetrahydrothiophenium perfluoro-n-octanesulfonate,
1-(3,5-dimethyl-4-hydroxyphenyl)tetrahydrothiophenium trifluoromethanesulfonate,
1-(3,5-dimethyl-4-hydroxyphenyl)tetrahydrothiophenium nonafluoro-n-butanesulfonate,
1-(3,5-dimethyl-4-hydroxyphenyl)tetrahydrothiophenium perfluoro-n-octanesulfonate, and the like.

(2) Sulfone Compounds:

As examples of sulfone compounds, β-ketosulfone, β-sulfonylsulfone, and α-diazo compounds of these compounds can be given.

As specific examples of sulfone compounds, phenacylphenylsulfone, mesitylphenacylsulfone, bis(phenylsulfonyl)methane, and 4-trisphenacylsulfone can be given.

(3) Sulfonate Compounds:

As examples of sulfonate compounds, alkyl sulfonate, haloalkyl sulfonate, aryl sulfonate, and imino sulfonate can be given.

As specific examples of sulfonate compounds, benzointosylate, pyrogallol tris (trifluoromethanesulfonate), pyrogallol tris(nonafluoro-n-butanesufonate), pyrogallol tris (methanesulfonate), nitrobenzyl-9,10-diethoxyanthracene-2-sulfonate, α-methylolbenzointosylate, α-methylolbenzoin n-octanesulfonate, α-methylolbenzoin trifluoromethanesulfonate, α-methylolbenzoin n-dodecanesulfonate, and the like can be given.

(4) Sulfonimide Compounds:

As examples of sulfonimide compounds, compounds of the following formula (4) can be given:

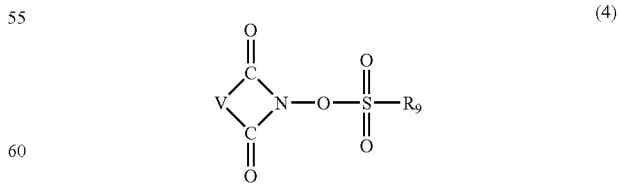

(4)

wherein V represents a divalent group such as an alkylene group, arylene group, or alkoxylene group and $R_9$ represents a monovalent group such as an alkyl group, aryl group, haloalkyl group, or haloaryl group.

Specific examples of sulfonimide compounds include:
N-(trifluoromethanesulfonyloxy)succinimide,
N-(trifluoromethanesulfonyloxy)phthalimide,
N-(trifluoromethanesulfonyloxy)diphenylmaleimide,
N-(trifluoromethanesulfonyloxy)bicyclo[2.2.1]hept-5-ene-2,3-dicarboxyimide,
N-(trifluoromethanesulfonyloxy)-7-oxabicyclo[2.2.1]hept-5-ene-2,3-dicarboxyimide,
N-(trifluoromethanesulfonyloxy)bicyclo[2.2.1]heptan-5,6-oxy-2,3-dicarboxyimide,
N-(trifluoromethanesulfonyloxy)naphthylimide,
N-(10-camphorsulfonyloxy)succinimide,
N-(10-camphorsulfonyloxy)phthalimide,
N-(10-camphorsulfonyloxy)diphenylmaleimide,
N-(10-camphorsulfonyloxy)bicyclo[2.2.1]hept-5-ene-2,3-dicarboxyimide,
N-(10-camphorsulfonyloxy)-7-oxabicyclo[2.2.1]hept-5-ene-2,3-dicarboxyimide,
N-(10-camphorsulfonyloxy)bicyclo[2.2.1]heptan-5,6-oxy-2,3-dicarboxyimide,
N-(10-camphorsulfonyloxy)naphthylimide,
N-(p-toluenesulfonyloxy)succinimide,
N-(p-toluenesulfonyloxy)phthalimide,
N-(p-toluenesulfonyloxy)diphenylmaleimide,
N-(p-toluenesulfonyloxy)bicyclo[2.2.1]hept-5-ene-2,3-dicarboxyimide,
N-(p-toluenesulfonyloxy)-7-oxabicyclo[2.2.1]hept-5-ene-2,3-dicarboxyimide,
N-(p-toluenesulfonyloxy)bicyclo[2.2.1]heptan-5,6-oxy-2,3-dicarboxyimide,
N-(p-toluenesulfonyloxy)naphthylimide,
N-(2-trifluoromethylbenzenesulfonyloxy)succinimide,
N-(2-trifluoromethylbenzenesulfonyloxy)phthalimide,
N-(2-trifluoromethylbenzenesulfonyloxy)diphenylmaleimide,
N-(2-trifluoromethylbenzenesulfonyloxy)bicyclo[2.2.1]hept-5-ene-2,3-dicarboxyimide,
N-(2-trifluoromethylbenzenesulfonyloxy)-7-oxabicyclo-[2.2.1]hept-5-ene-2,3-dicarboxyimide,
N-(2-trifluoromethylbenzenesulfonyloxy)bicyclo[2.2.1]-heptan-5,6-oxy-2,3-dicarboxyimide,
N-(2-trifluoromethylbenzenesulfonyloxy)naphthylimide,
N-(4-trifluoromethylbenzenesulfonyloxy)succinimide,
N-(4-trifluoromethylbenzenesulfonyloxy)phthalimide,
N-(4-trifluoromethylbenzenesulfonyloxy)diphenylmaleimide,
N-(4-trifluoromethylbenzenesulfonyloxy)bicyclo[2.2.1]hept-5-ene-2,3-dicarboxyimide,
N-(4-trifluoromethylbenzenesulfonyloxy)-7-oxabicyclo-[2.2.1]hept-5-ene-2,3-dicarboxyimide,
N-(4-trifluoromethylbenzenesulfonyloxy)bicyclo[2.2.1]-heptan-5,6-oxy-2,3-dicarboxyimide,
N-(4-trifluoromethylbenzenesulfonyloxy)naphthylimide,
N-(nonafluoro-n-butanesulfonyloxy)succinimide,
N-(nonafluoro-n-butanesulfonyloxy)phthalimide,
N-(nonafluoro-n-butanesulfonyloxy)diphenylmaleimide,
N-(nonafluoro-n-butanesulfonyloxy)bicyclo[2.2.1]hept-5-ene-2,3-dicarboxyimide,
N-(nonafluoro-n-butanesulfonyloxy)-7-oxabicyclo[2.2.1]hept-5-ene-2,3-dicarboxyimide,
N-(nonafluoro-n-butanesulfonyloxy)bicyclo[2.2.1]heptan-5,6-oxy-2,3-dicarboxyimide,
N-(nonafluoro-n-butanesulfonyloxy)naphthylimide,
N-(pentafluorobenzenesulfonyloxy)succinimide,
N-(pentafluorobenzenesulfonyloxy)phthalimide,
N-(pentafluorobenzenesulfonyloxy)diphenylmaleimide,
N-(pentafluorobenzenesulfonyloxy)bicyclo[2.2.1]hept-5-ene-2,3-dicarboxyimide,
N-(pentafluorobenzenesulfonyloxy)-7-oxabicyclo[2.2.1]hept-5-ene-2,3-dicarboxyimide,
N-(pentafluorobenzenesulfonyloxy)bicyclo[2.2.1]heptan-5,6-oxy-2,3-dicarboxyimide,
N-(pentafluorobenzenesulfonyloxy)naphthylimide,
N-(perfluoro-n-octanesulfonyloxy)succinimide,
N-(perfluoro-n-octanesulfonyloxy)phthalimide,
N-(perfluoro-n-octanesulfonyloxy)diphenylmaleimide,
N-(perfluoro-n-octanesulfonyloxy)bicyclo[2.2.1]hept-5-ene-2,3-dicarboxyimide,
N-(perfluoro-n-octanesulfonyloxy)-7-oxabicyclo[2.2.1]hept-5-ene-2,3-dicarboxyimide,
N-(perfluoro-n-octanesulfonyloxy)bicyclo[2.2.1]heptan-5,6-oxy-2,3-dicarboxyimide,
N-(perfluoro-n-octanesulfonyloxy)naphthylimide, and
N-((5-methyl-5-carboxymethanebicyclo[2.2.1]hept-2-yl)-sulfonyloxy)succinimide.

(5) Diazomethane Compounds:

As examples of diazomethane compounds, compounds shown by the following formula (5) and the like can be given:

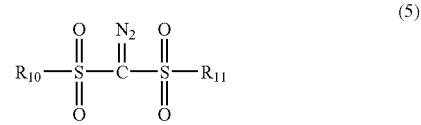

(5)

wherein $R_{10}$ and $R_{11}$ individually represent a monovalent group such as an alkyl group, aryl group, haloalkyl group, and haloaryl group.

As specific examples of diazomethane compounds, bis(trifluoromethanesulfonyl)diazomethane, bis(cyclohexanesulfonyl)diazomethane, bis(benzenesulfonyl)diazomethane, bis(p-toluenesulfonyl)diazomethane, methanesulfonyl-p-toluenesulfonyldiazomethane, cyclohexanesulfonyl-1,1-dimethylethylsulfonyldiazomethane, bis(1,1-dimethyletanesulfonyl)diazomethane, bis(3,3-dimethyl-1,5-dioxaspiro[5.5]dodecane-8-sulfonyl)-diazomethane, bis(1,4-dioxaspiro[4.5]decane-7-sulfonyl)diazomethane, and the like can be given.

(6) Disulfonylmethane Compounds

As examples of disulfonylmethane compounds, a compound of the following formula (6) can be given:

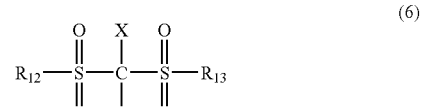

(6)

wherein $R_{12}$ and $R_{13}$ individually represent a linear or branched monovalent aliphatic hydrocarbon group, cycloalkyl group, aryl group, aralkyl group, or other monovalent organic group having a hetero atom, X and Y individually represent an aryl group, hydrogen atom, linear or branched monovalent aliphatic hydrocarbon group, or other monovalent organic group having a hetero atom, provided that at least one of X and Y represents an aryl group, or X and Y bond to form a monocyclic or polycyclic ring having at least one unsaturated bond, or X and Y bond to form a group of the following formula:

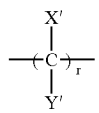

wherein the groups X' and the groups Y' individually represent a hydrogen atom, halogen atom, a linear or branched alkyl group, cycloalkyl group, aryl group, or aralkyl group, or X' and Y', each bonding to the same or different carbon atoms, bond to form a monocyclic carbon structure, and r is an integer from 2 to 10.

Onium salt compounds (1) and sulfonimide compounds (4) are preferable as the acid generator (B). The use of at least one compound selected from the group consisting of the following compounds as the acid generator is particularly preferable. bis(4-t-butylphenyl)iodonium trifluoromethanesulfonate, bis(4-t-butylphenyl)iodonium perfluoro-n-butanesulfonate, bis(4-t-butylphenyl)iodonium p-toluenesulfonate, bis(4-t-butylphenyl)iodonium 10-camphorsulfonate, bis(4-t-butylphenyl)iodonium 2-trifluoromethylbenzenesulfonate, bis(4-t-butylphenyl)iodonium 4-trifluoromethylbenzenesulfonate, bis(4-t-butylphenyl) iodonium 2,4-difluorobenzenesulfonate, triphenylsulfonium trifluoromethanesulfonate, triphenylsulfonium perfluoro-n-butanesulfonate, triphenylsulfonium p-toluenesulfonate, triphenylsulfonium 10-camphorsulfonate, triphenylsulfonium 2-trifluoromethylbenzenesulfonate, triphenylsulfonium 4-trifluorobenzenesulfonate, triphenylsulfonium 2,4-difluoromethylbenzensulfonate, N-(trifluoromethanesulfonyloxy)succinimide, N-(trifluoromethanesulfonyloxy)bicyclo[2.2.1]hept-5-ene-2,3-dicarboxyimide, N-(10-camphorsulfonyloxy)succinimide, N-(10-camphorsulfonyloxy)bicyclo[2.2.1]hept-5-ene-2,3-dicarboxyimide, and N-{(5-methyl-5-carboxymethanebicyclo[2.2.1]hept-2-yl)-sulfonyloxy}succinimide.

The amount of the acid generator (B) used is preferably 0.1–20 parts by weight, and more preferably 0.5–15 parts by weight, for 100 parts by weight of the polymer component (A) In the present invention, the above-described compounds of the acid generator (B) may be used either individually or in combination of two or more.

Other Components

Acid Diffusion Controller:

It is preferable to add an acid diffusion controller to the radiation-sensitive resin composition of the present invention. The acid diffusion controller controls diffusion of an acid generated from the acid generator (B) upon exposure in the resist film to hinder unfavorable chemical reactions in the unexposed area.

The addition of the acid diffusion controller improves storage stability of the composition and resolution as a resist. Moreover, the addition of the acid diffusion controller prevents the line width of the resist pattern from changing due to variation of post-exposure delay (PED) from exposure to post-exposure heat treatment, whereby a composition with remarkably superior process stability can be obtained.

As the acid diffusion controller, organic compounds containing nitrogen of which the basicity does not change during exposure or heating for forming a resist pattern are preferable.

As the organic compounds containing nitrogen, for example, the following formula (7), (hereinafter referred to as "nitrogen-containing compound (I)");

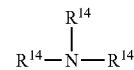

wherein the groups $R_{14}$ individually represent a hydrogen atom, alkyl group, aryl group, or aralkyl group which are either unsubstituted or substituted by a functional group such as a hydroxyl group, a diamino compound having two nitrogen atoms in the molecule (hereinafter referred to as "nitrogen-containing compound (II)"), a diamino polymer having three or more nitrogen atoms in the molecule (hereinafter referred to as "nitrogen-containing compound (III)"), an amide group-containing compound, urea compound, nitrogen-containing heterocyclic compound, and the like can be given.

Examples of the nitrogen-containing compound (I) include monoalkylamines such as n-hexylamine, n-heptylamine, n-octylamine, n-nonylamine, and n-decylamine; dialkylamines such as di-n-butylamine, di-n-pentylamine, di-n-hexylamine, di-n-heptylamine, di-n-octylamine, di-n-nonylamine, and di-n-decylamine; trialkylamines such as triethylamine, tri-n-propylamine, tri-n-butylamine, tri-n-pentylamine, tri-n-hexylamine, tri-n-heptylamine, tri-n-octylamine, tri-n-nonylamine, and tri-n-decylamine; alkanolamines such as ethanolamine, diethanolamine, and triethanolamine; and aromatic amines such as aniline, N-methylaniline, N,N-dimethylaniline, 2-methylaniline, 3-methylaniline, 4-methylaniline, 4-nitroaniline, diphenylamine, triphenylamine, and 1-naphthylamine.

Examples of the nitrogen-containing compounds (II) include ethylenediamine, N,N,N',N'-tetramethylethylenediamine, N,N,N',N'-tetrakis(2-hydroxypropyl)ethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2'-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, and 1,3-bis[1-(4-aminophenyl)-1-methylethyl]benzene.

As examples of the nitrogen-containing compound (III), polyethyleneimine, polyallylamine, a polymer of dimethylaminoethylacrylamide, and the like can be given. Examples of compounds containing an amide group include formamide, N-methylformamide, N,N-dimethylformamide, acetamide, N-methylacetamide, N,N-dimethylacetamide, propionamide, benzamide, pyrrolidone, and N-methylpyrrolidone.

Examples of urea compounds include urea, methylurea, 1,1-dimethylurea, 1,3-dimethylurea, 1,1,3,3-tetramethylurea, 1,3-diphenylurea, and tributylthiourea.

Examples of the nitrogen-containing heterocyclic compounds include imidazoles such as imidazole, benzimidazole, 4-methylimidazole, 4-methyl-2-phenylimidazole, and 2-phenylbenzimidazole; pyridines such as pyridine, 2-methylpyridine, 4-methylpyridine, 2-ethylpyridine, 4-ethylpyridine, 2-phenylpyridine, 4-phenylpyridine, N-methyl-4-phenylpyridine, nicotine, nicotinic acid, nicotinamide, quinoline, 8-oxyquinoline, and acridine; pyrazine, pyrazole, pyridazine, quinoxaline, purine, pyrrolidine, piperidine, morpholine, 4-methylmorpholine, piperazine, 1,4-dimethylpiperazine, and 1,4-diazabicyclo[2.2.2]octane.

A base precursor having an acid-dissociable group can also be used as a nitrogen-containing organic compound. As examples of base precursors N-(t-butoxycarbonyl)piperidine, N-(t-butoxycarbonyl)imidazole, N-(t-butoxycarbonyl)benzimidazole, N-(t-butoxycarbonyl)-2-phenylbenzimidazole, N-(t-butoxycarbonyl)di-n-octylamine, N-(t-butoxycarbonyl)diethanolamine, N-(t-butoxycarbonyl) dicyclohexylamine, and N-(t-butoxycarbonyl) diphenylamine can be given.

Of these nitrogen-containing organic compounds, the nitrogen-containing compounds (I), nitrogen-containing compounds (II), and nitrogen-containing heterocyclic compounds are preferable.

These acid diffusion controller compounds may be used either individually or in combination of two or more. The amount of the acid diffusion controller to be added is preferably 15 parts by weight or less, more preferably 0.001–10 parts by weight, and particularly preferably 0.005–5 parts by weight for 100 parts by weight of the polymer component (A) If the amount of the acid diffusion controller is too large, sensitivity as a resist and developability of the exposed area tend to decrease. If to small, accuracy of pattern profiles and dimensions as a resist may decrease depending on processing conditions.

Alkali-Soluble Resin:

An alkali-soluble resin can be optionally added to the radiation-sensitive resin composition of the present invention.

As examples of alkali-soluble resins, poly(m-hydroxystyrene), poly(p-hydroxystyrene), partially hydrogenated poly(p-hydroxystyrene), p-hydroxystyrene/m-hydroxystyrene copolymer, p-hydroxystyrene/styrene copolymer, novolac resin, polyvinyl alcohol, and polyacrytic acid can be given.

The polystyrene-reduced weight average molecular weight (Mw) of the alkali-soluble resin determined by gel permeation chromatography is usually 1,000–1,000,000, and preferably 2,000–100,000.

These alkali-soluble resins may be used either individually or in combination of two or more.

The amount of alkali-soluble resins to be added is 30 parts by weight or less for 100 parts by weight of the polymer component (A).

Surfactant:

Surfactants exhibiting an action of improving the applicability or striation of the composition and developability as a resist may be added to the radiation-sensitive resin composition of the present invention.

Examples of such surfactants include polyoxyethylene lauryl ether, polyoxyethylene stearyl ether, polyoxyethylene oleyl ether, polyoxyethylene n-octyl phenol ether, polyoxyethylene n-nonyl phenol ether, polyethylene glycol dilaurate, polyethylene glycol distearate; and commercially available products such as FTOP EF301, EF303, EF352 (manufactured by TOHKEM PRODUCTS CORPORATION), MEGAFAC F171, F173 (manufactured by Dainippon Ink and Chemicals, Inc.), Fluorad FC430, FC431 (manufactured by Sumitomo 3M Ltd.), Asahi Guard AG710, Surflon S-382, SC-101, SC-102, SC-103, SC-104, SC-105, SC-106 (manufactured by Asahi Glass Co., Ltd.), KP341 (manufactured by Shin-Etsu Chemical Co., Ltd.), and Polyflow No. 75, No. 95 (manufactured by Kyoeisha Chemical Co., Ltd.).

These surfactants may be used either individually or in combination of two or more.

The amount of surfactants to be added is preferably 2 parts by weight or less for 100 parts by weight of the polymer component (A).

Photosensitizer:

A photosensitizer may be incorporated in the radiation curable resin composition of the present invention.

As examples of photosensitizers, carbazoles, benzophenones, rose bengals, and anthracenes can be given.

The amount of photosensitizers to be added is preferably 50 parts by weight or less for 100 parts by weight of the polymer component (A).

Other Additives:

In addition, a dye and/or a pigment may be added to visualize latent images of exposed areas and to reduce the effect of halation during exposure. An adhesion adjuvant may be added to improve adhesion to the substrate. As other additives, halation inhibitors such as 4-hydroxy-4'-methylchalcone, form improvers, preservation stabilizers, antifoaming agents, and the like can be added.

Solvent

The radiation-sensitive resin composition of the present invention is used as a composition solution. Such a composition solution is prepared by homogeneously dissolving the composition in a solvent so that the total solid concentration is 0.1–50 wt %, and preferably 1–40 wt %, and filtering the solution through a filter with a pore diameter of about 0.2 µm. Examples of solvents used for preparation of the composition solution include: ethylene glycol monoalkyl ether acetates such as ethylene glycol monomethyl ether acetate, ethylene glycol monoethyl ether acetate, ethylene glycol mono-n-propyl ether acetate, and ethylene glycol mono-n-butyl ether acetate; propylene glycol monoalkyl ethers such as propylene glycol monomethyl ether, propylene glycol monoethyl ether, propylene glycol mono-n-propyl ether, and propylene glycol mono-n-butyl ether; propylene glycol dialkyl ethers such as propylene glycol dimethyl ether, propylene glycol diethyl ether, propylene glycol di-n-propyl ether, and propylene glycol di-n-butyl ether; propylene glycol monoalkyl ether acetates such as propylene glycol monomethyl ether acetate, propylene glycol monoethyl ether acetate, propylene glycol mono-n-propyl ether acetate, and propylene glycol mono-n-butyl ether acetate; lactic acid esters such as methyl lactate, ethyl lactate, n-propyl lactate, and i-propyl lactate; aliphatic carboxylic acid esters such as n-amyl formate, i-amyl formate, ethyl acetate, n-propyl acetate, i-propyl acetate, n-butyl acetate, i-butyl acetate, n-amyl acetate, i-amyl acetate, i-propyl propionate, n-butyl propionate, and i-butyl propionate; other esters such as ethyl hydroxyacetate, ethyl 2-hydroxy-2-methylpropionate, methyl 2-hydroxy-3-methylbutyrate, ethyl methoxyacetate, ethyl ethoxyacetate, methyl 3-methoxypropionate, ethyl 3-methoxypropionate, methyl 3-ethoxypropionate, ethyl 3-ethoxypropionate, butyl 3-methoxyacetate, butyl 3-methyl-3-methoxyacetate, butyl 3-methyl-3-methoxypropionate, butyl 3-methyl-3-methoxybutyrate, methyl acetoacetate, ethyl acetoacetate, methylpyruvate, and ethyl pyruvate; aromatic hydrocarbons such as toluene and xylene; ketones such as methyl ethyl ketone, methyl n-propyl ketone, methyl n-butyl ketone, 2-heptanone, 3-heptanone, 4-heptanone, and cyclohexanone; amides such as N-methylformamide, N,N-dimethylformamide, N-methylacetamide, N,N-dimethyl acetamide, and N-methylpyrrolidone; and lactones such as γ-butyrolactone can be given.

These solvents may be used either individually or in combination of two or more.

Formation of Resist Pattern

A resist pattern is formed from the radiation-sensitive resin composition of the present invention by applying the composition solution prepared as mentioned above to substrates such as a silicon wafer or a wafer covered with aluminum using an appropriate application method such as rotational coating, cast coating, and roll coating to form a resist film. The coating is optionally heated at a temperature of about 70–160° C. (hereinafter referred to as "PB") to make a resist film, which is then exposed to light through a predetermined mask pattern. Radiation used here can be appropriately selected according to the types of acid generator (B) from among ultraviolet rays such as an $F_2$ excimer laser (wavelength: 157 nm), ArF excimer laser (wavelength: 193 nm), a KrF excimer laser (wavelength: 248 nm), or EUV (wavelength: 13 nm, etc.), X-rays such as synchrotron radiation, and charged particle rays such as electron beams. The exposure conditions such as the dose are appropriately determined depending on the composition of the radiation-sensitive resin composition, types of additives, and the like.

In the present invention, it is preferable to perform post-exposure bake (hereinafter referred to as "PEB") at 70–160° C. for 30 seconds or more to consistently form minute resist patterns with high precision. If the heating temperature for PEB is less than 70° C., sensitivity may fluctuate according to the type of substrates.

A desired resist pattern is obtained by developing the resist using an alkaline developer at 10–50° C. for 10–200 seconds, preferably at 15–30° C. for 15–100 seconds, and still more preferably at 20–25° C. for 15–90 seconds.

As the alkaline developer, an alkaline aqueous solution prepared by dissolving an alkali such as an alkali metal hydroxide, aqueous ammonia, mono-, di-, or tri-alkylamine, mono-, di-, or tri-alkanolamine, heterocyclic amine, tetraalkylammonium hydroxide, choline, 1,8-diazabicyclo[5.4.0]-7-undecene, or 1,5-diazabicyclo[4.3.0]-5-nonene to a concentration of 1–10 wt %, preferably 1–5 wt %, and more preferably 1–3 wt % can be used.

Moreover, an appropriate amount of a water-soluble organic solvent such as methanol and ethanol or a surfactant can be added to the developer comprising the above alkaline aqueous solution.

When forming a resist pattern, a protective film may be provided on the resist film in order to prevent an adverse effect of basic impurities and the like which are present in the environmental atmosphere.

EXAMPLES

The present invention will be described in more detail by way of examples. However, these examples should not be construed as limiting the present invention. Mw and Mn used in the description hereinafter refer to the weight average or number average polystyrene-reduced molecular weight determined GPC.

Synthesis Example 1

104 g of p-acetoxystyrene, 17 g of 1-ethylcyclopentyl acrylate, 29 g of p-t-butoxystyrene, 6 g of azobisisobutylonitrile, and 1 g of t-dodecylmercaptan were dissolved in 160 g of propylene glycol monomethyl ether. The mixture was polymerized for 16 hours at 70° C. in a nitrogen atmosphere. After polymerization, the reaction solution was added dropwise to a large. quantity of n-hexane to coagulate and purify the resulting polymer.

After the addition of 150 g of propylene glycolmonomethyl ether to the resin, 300 g of methanol, 80 g of triethylamine, and 15 g of water were added. The mixture was hydrolyzed for 8 hours while refluxing at the boiling point. After the reaction, the solvent and triethylamine were evaporated under reduced pressure. The resulting resin was dissolved in acetone and added dropwise to a large quantity of water to coagulate the resin. The resulting white powder was filtered and dried overnight at 50° C. under reduced pressure.

The resin was found to have Mw and Mw/Mn of 15,000 and 1.8 respectively. The result of $^{13}$C-NMR analysis confirmed that the copolymerization molar ratio of p-hydroxystyrene, 1-ethylcyclopentyl acrylate, and p-t-butoxystyrene of the copolymer was 71:11:18. This resin is referred to as a "polymer (a-i)".

Mw and Mn of the polymer (a-i) and the polymers prepared in Synthesis Examples 2–9 were measured by gel permeation chromatography (GPC) using GPC columns (manufactured by Tosoh Corp., G2000H$_{XL}$×2; G3000H$_{XL}$×1, G4000H$_{XL}$×1) under the following conditions. Flowrate: 1.0 ml/minute, eluate: tetrahydrofuran, column temperature: 40° C., standard reference material: monodispersed polystyrene Synthesis Example 2

101 g of p-acetoxystyrene, 45 g of 1-ethylcyclopentyl acrylate, 6 g of azobisisobutylonitrile, and 1 g of t-dodecylmercaptan were dissolved in 160 g of propylene glycol monomethyl ether. The mixture was polymerized for 16 hours at 70° C. in a nitrogen atmosphere. After polymerization, the reaction solution was added dropwise to a large quantity of n-hexane to coagulate and purify the resulting polymer.

After the addition of 150 g of propylene glycolmonomethyl ether to the polymer, 300 g of methanol, 80 g of triethylamine, and 15 g of water were added. The mixture was hydrolyzed for 8 hours while refluxing at the boiling point. After the reaction, the solvent and triethylamine were evaporated under reduced pressure. The resulting polymer was dissolved in acetone and added dropwise to a large quantity of water to coagulate the resin. The resulting white powder was filtered and dried overnight at 50° C. under reduced pressure.

The polymer was found to have Mw and Mw/Mn of 16,000 and 1.9 respectively. The result of $^{13}$C-NMR analysis confirmed that the copolymerization molar ratio of p-hydroxystyrene and 1-ethylcyclopentyl acrylate was 70:30. This polymer is referred to as a "polymer (a-ii)".

Synthesis Example 3

176 g of p-t-butoxystyrene was anionically polymerized at −78° C. in 500 ml of tetrahydrofuran using n-butyllithium as a catalyst. After polymerization, the resulting resin solution was coagulated in methanol to obtain 150 g of white poly(p-t-butoxystyrene).

The poly(p-t-butoxystyrene) was dissolved in 600 g of dioxane. After the addition of diluted hydrochloric acid, the mixture was hydrolyzed at 70° C. for 2 hours. A white resin was obtained by adding the reaction product dropwise to a large quantity of water, thereby causing the resin to coagulate. A step of dissolving the resulting polymer in acetone and coagulating the resin in a large quantity of water was repeated. The resulting white powder was filtered and dried overnight at 50° C. under reduced pressure.

The Mw and Mw/Mn of this polymer were 10,400 and 1.10, respectively. $^{13}$C-NMR analysis confirmed that the resin is a copolymer of p-t-butoxystyrene and p-hydroxystyrene at a copolymerization molar ratio of 32:68, in which only part of t-butyl group in the poly(p-t-butoxystyrene) had a hydrolyzed structure. This polymer is referred to as a "polymer (a-iii)".

Synthesis Example 4

106 g of t-butoxystyrene, 4 g of azobisisobutyronitrile, and 0.6 g of t-dodecylmercaptan were dissolved in 110 g of propylene glycol monomethyl ether. The mixture was polymerized for 16 hours while maintaining the reaction temperature at 70° C. in a nitrogen atmosphere. After polymerization, the reaction solution was added dropwise to a large quantity of n-hexane to coagulate and purify the resulting resin. The resulting resin was dissolved in acetone and added dropwise to a large quantity of water to coagulate the resin. The produced white powder was filtered and dried overnight at 50° C. under reduced pressure. The polymer thus obtained had a molecular weight of 13,000 and an Mw/Mn ratio of 1:8.

Then, 25 g of the poly(p-hydroxystyrene) was dissolved in 100 g of n-butyl acetate. Nitrogen gas was injected to the mixture for 30 minutes. After the addition of 3.4 g of ethyl vinyl ether and 1 g of pyridinium p-toluenesulfonate as a catalyst, the mixture was allowed to react at room temperature for 12 hours. The reaction solution was dropped into a 1 wt % ammonium aqueous solution to coagulate the polymer. The polymer was filtered and dried overnight at 50° C. under reduced pressure.

As a result of $^1$H-NMR analysis, the polymer was found to have a structure in which 20 mol % of hydrogen atoms of phenolic hydroxyl groups in poly(p-hydroxystyrene) was replaced by ethoxyethyl groups. This polymer is referred to as a "polymer (a-iv)".

Synthesis Example 5

106 g of p-acetoxystyrene, 12 g of 1-ethylcyclopentyl acrylate, 6 g of azobisisobutylonitrile, and 1 g of t-dodecylmercaptan were dissolved in 160 g of propylene glycol monomethyl ether. The mixture was polymerized for 16 hours at 70° C. in a nitrogen atmosphere. After polymerization, the reaction solution was added dropwise to a large quantity of n-hexane to coagulate and purify the resulting resin.

After the addition of 150 g of propylene glycol monomethyl ether to the resin, 300 g of methanol, 80 g of triethylamine, and 15 g of water were added. The mixture was hydrolyzed for 8 hours while refluxing at the boiling point. After the reaction, the solvent and triethylamine were evaporated under reduced pressure. The resulting resin was dissolved in acetone and added dropwise to a large quantity of water to coagulate the resin. The resulting white powder was filtered and dried overnight at 50° C. under reduced pressure.

The polymer was found to have Mw and Mw/Mn of 14,000 and 1.7 respectively. The result of $^{13}$C-NMR analysis confirmed that the copolymerization molar ratio of p-hydroxystyrene and 1-ethylcyclopentyl acrylate was 90:10. Then, 25 g of the resulting copolymer of p-hydroxystyrene and 1-ethylcyclopentyl acrylate was dissolved in 100 g of n-butyl acetate. Nitrogen gas was injected to the mixture for 30 minutes. After the addition of 3.3 g of ethyl vinyl ether and 1 g of pyridinium p-toluenesulfonate as a catalyst, the mixture was allowed to react at room temperature for 12 hours. The reaction solution was added dropwise into a 1 wt % ammonium aqueous solution to coagulate the polymer. The polymer was filtered and dried overnight at 50° C. under reduced pressure.

As a result of $^1$H-NMR analysis, the resulting polymer was found to have a structure in which 23.mol % of hydrogen atoms of phenolic hydroxyl groups in poly(p-hydroxystyrene) was replaced by ethoxyethyl groups and to be a copolymer containing a p-hydroxystyrene unit, p-(ethoxyethoxy)styrene unit, and 1-ethylcyclopentyl acrylate unit at a molar ratio of 69:21:10. This copolymer is referred to as a "polymer (a-v)".

Synthesis Example 6

106 g of p-acetoxystyrene, 20 g of styrene, 26 g of p-t-butoxystyrene, 6 g of azobisisobutylonitrile, and 1 g of t-dodecylmercaptan were dissolved in 160 g of propylene glycol monomethyl ether. The mixture was polymerized for 16 hours at 70° C. in a nitrogen atmosphere. After polymerization, the reaction solution was added dropwise to a large quantity of n-hexane to coagulate and purify the resulting resin.

After the addition of 150 g of propylene glycol monomethyl ether to the resin, 300 g of methanol, 80 g of triethylamine, and 15 g of water were added. The mixture was hydrolyzed for 8 hours while refluxing at the boiling point. After the reaction, the solvent and triethylamine were evaporated under reduced pressure. The resulting resin was dissolved in acetone and added dropwise to a large quantity of water to coagulate the resin. The resulting white powder was filtered and dried overnight at 50° C. under reduced pressure.

The polymer was found to have Mw and Mw/Mn of 16,000 and 1.7 respectively. The result of $^{13}$C-NMR analysis confirmed that the copolymerization molar ratio of p-hydroxystyrene, styrene, and p-t-butoxystyrene of the copolymer was 65:20:15. This polymer is referred to as a "polymer (a-vi)".

Synthesis Example 7

104 g of p-acetoxystyrene, 18 g of 1-ethylcyclohexyl acrylate, 29 g of p-t-butoxystyrene, 6 g of azobisisobutylonitrile, and 1 g of t-dodecylmercaptan were dissolved in 160 g of propylene glycol monomethyl ether. The mixture was polymerized for 16 hours at 70° C. in a nitrogen atmosphere. After polymerization, the reaction solution was added dropwise to a large quantity of n-hexane to coagulate and purify the resulting resin.

After the addition of 150 g of propylene glycol monomethyl ether to the resin, 300 g of methanol, 80 g of triethylamine, and 15 g of water were added. The mixture was hydrolyzed for 8 hours while refluxing at the boiling point. After the reaction, the solvent and triethylamine were evaporated under reduced pressure. The resulting resin was dissolved in acetone and added dropwise to a large quantity of water to coagulate the resin. The resulting white powder was filtered and dried overnight at 50° C. under reduced pressure.

The resin was found to have Mw and Mw/Mn of 13,000 and 1.7 respectively. The result of $^{13}$C-NMR analysis confirmed that the copolymerization molar ratio of p-hydroxystyrene, 1-ethylcyclohexyl acrylate, and p-t-butoxystyrene of the copolymer was 71:11:18. This polymer is referred to as a "polymer (a-vii)".

Synthesis Example 8

31 g of ethylcyclopentyl acrylate, 166 g of acetoxystyrene, 22 g of styrene, 9.4 g of azobisisobutyronitrile, and 1.1 g of t-dodecylmercaptan were dissolved in 220 g of propylene glycol monomethyl ether. The mixture was heated at 70° C. for 6 hours while stirring. The polymer obtained was added to a large amount of hexane to reprecipitate, which was dissolved again in 200 g of propylene glycol monomethyl ether. After the addition of 400 g of methanol, 100 g of triethylamine, and 20 g of water, the mixture was refluxed for 7 hours. The resulting solution was poured into a large amount of water to reprecipitate the resin, which was dried under vacuum to obtain a white solid resin. The resin was found to have Mw and Mw/Mn of 15,000 and 2.2 respectively. The result of $^{13}$C-NMR analysis confirmed that the copolymerization molar ratio of p-hydroxystyrene, 1-ethylcyclohexyl acrylate, and styrene of the copolymer was 72:13:15. This polymer is referred to as a "polymer (a-viii)". The IR spectrum of the polymer is shown in FIG. 1. The positions of the peaks 1–21 in the spectrum shown in FIG. 1 are shown in Table 1.

TABLE 1

| Peak No. | Wave number (cm$^{-1}$) | Peak No. | Wave number (cm$^{-1}$) |
| --- | --- | --- | --- |
| 1 | 2972.57 | 11 | 1170.90 |
| 2 | 2924.35 | 12 | 1107.24 |
| 3 | 2694.80 | 13 | 956.78 |
| 4 | 1765.03 | 14 | 829.47 |
| 5 | 1697.51 | 15 | 763.88 |
| 6 | 1612.64 | 16 | 731.09 |
| 7 | 1514.26 | 17 | 702.15 |
| 8 | 1450.60 | 18 | 642.35 |
| 9 | 1379.23 | 19 | 538.19 |
| 10 | 1242.27 | 20 | 489.96 |
| | | 21 | 435.95 |

Synthesis Example 9

Figure 2:
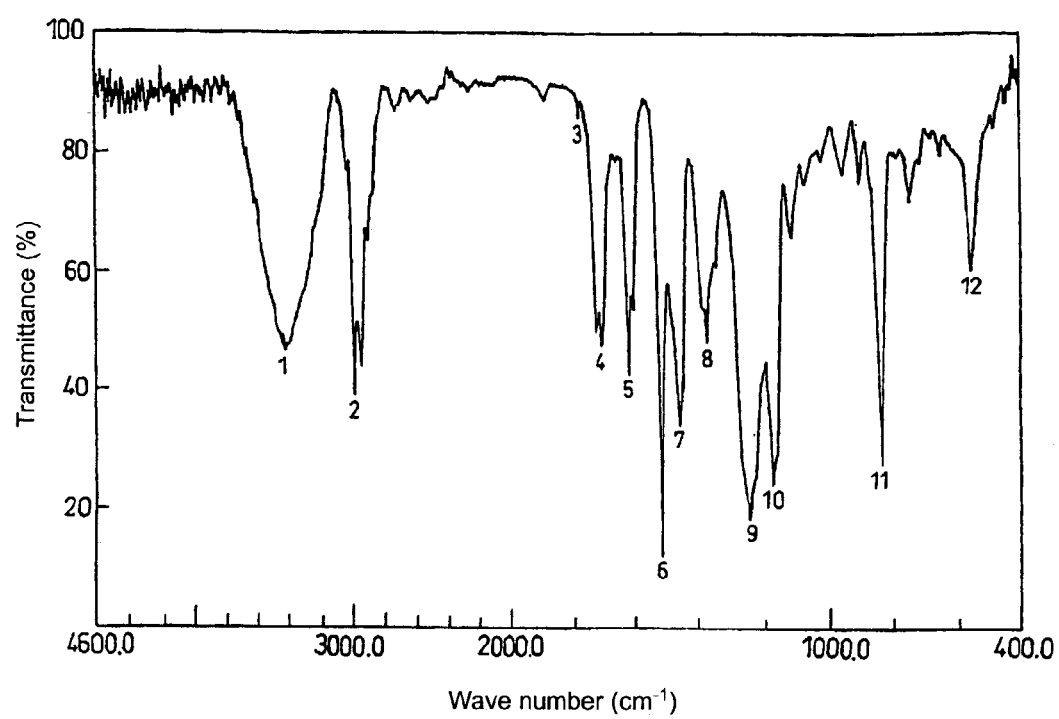
FIG. 2 is an IR absorption spectrum of the polymer (a-ix) obtained in Synthesis Example 9.

39 g of ethylcyclopentyl acrylate, 110 g of acetoxystyrene, 16 g of p-(t-butoxy)styrene, 6.5 g of azobisisobutyronitrile, and 0.8 g of t-dodecylmercaptan were dissolved in 165 g of propylene glycol monomethyl ether. The mixture was heated at 70° C. for 6 hours while stirring. The polymer solution obtained was added to a large amount of hexane to reprecipitate, which was dissolved again in 200 g of propylene glycol monomethyl ether. After the addition of 400 g of methanol, 100 g of triethylamine, and 20 g of water, the mixture was refluxed for 7 hours. The resulting solution was poured into a large amount of water to reprecipitate the resin, which was dried under vacuum to obtain a white solid resin. The resin was found to have Mw and Mw/Mn of 18,000 and 2.0 respectively. The result of $^{13}$C-NMR analysis confirmed that the copolymerization molar ratio of p-hydroxystyrene, 1-ethylcyclohexyl acrylate, and p-(t-butoxy)styrene of the copolymer was 68:23:9. This polymer is referred to as a "polymer (a-ix)". The IR spectrum of the polymer is shown in FIG. 2. The positions of the peaks 1–12 in the spectrum shown in FIG. 2 are shown in Table 2.

TABLE 2

| Peak No. | Wave number (cm$^{-1}$) | Peak No. | Wave number (cm$^{-1}$) |
| --- | --- | --- | --- |
| 1 | 3410.45 | 11 | 1450.60 |
| 2 | 2974.50 | 12 | 1367.65 |
| 3 | 1765.03 | 13 | 1238.41 |
| 4 | 1699.44 | 14 | 1170.90 |
| 5 | 1612.64 | 15 | 829.47 |
| 6 | 1514.26 | 12 | 553.62 |

Synthesis Example 10

25 g of a copolymer of p-hydroxystyrene and p-t-butoxystyrene (VPT1503S manufactured by Nippon Soda Co., Ltd.), at a ratio of 90:10, was dissolved in 100 g of n-butyl acetate. Nitrogen gas was bubbled through the mixture for 30 minutes. After the addition of 3.3 g of ethyl vinyl ether and 1 g of pyridinium p-toluenesulfonate as a catalyst, the mixture was reacted at room temperature for 12 hours. The reaction solution was added dropwise to a large quantity of 1 wt % ammonium aqueous solution to coagulate the resin. The resin was filtered and dried overnight in-a vacuum drier at 50° C.

Mw and Mw/Mn of this resin were respectively 13,000 and 1.01. As a result of $^{13}$C-NMR analysis, the resin was found to have a structure in which 23 mol % of hydrogen atoms of a phenolic hydroxyl group in poly(p-hydroxystyrene) was replaced by ethoxyethyl groups and 10 mol % by t-butyl groups. This polymer is referred to as a "polymer (a-x)".

Examples 1–15 and Comparative Example 1

Components shown in Table 3 (part(s) indicates part(s) by weight) were mixed to prepare homogeneous solutions.

TABLE 3

| | Polymer component (A) | Acid generator (B) | Acid diffusion controller | Solvent |
| --- | --- | --- | --- | --- |
| Example 1 | a-i (100) | B-4 (4) | C-5 (0.1) | D-1 (400) D-3 (400) |
| Example 2 | a-ii (60) a-iii (40) | B-2 (2) B-4 (2) | C-3 (0.1) | D-1 (400) D-3 (400) |
| Example 3 | a-ii (50) a-iv (50) | B-5 (4) | C-2 (0.1) | D-1 (400) D-3 (400) |
| Example 4 | a-v (100) | B-5 (4) B-6 (0.5) | C-2 (0.1) | D-1 (400) D-3 (400) |
| Example 5 | a-i (100) | B-4 (5) B-7 (1) | C-5 (0.2) | D-1 (400) D-3 (400) |
| Example 6 | a-i (100) | B-2 (2) B-3 (2) | C-4 (0.2) | D-1 (400) D-2 (400) |
| Example 7 | a-i (100) | B-1 (2) B-2 (2) | C-4 (0.2) | D-1 (400) D-4 (400) |
| Example 8 | a-vii (100) | B-4 (4) | C-5 (0.1) | D-1 (400) D-3 (400) |
| Example 9 | a-i (100) | B-6 (4) | C-5 (0.1) | D-2 (1500) |
| Example 10 | a-i (100) | B-6 (4) | C-5 (0.1) | D-2 (1000) |
| Example 11 | a-iii (60) a-ix (40) | B-4 (4) | C-5 (0.1) | D-1 (400) D-3 (400) |
| Example 12 | a-iv (60) a-ix (40) | B-5 (4) | C-5 (0.1) | D-1 (200) D-3 (600) |
| Example 13 | a-x (60) a-ix (40) | B-4 (4) | C-5 (0.1) | D-1 (400) D-3 (400) |
| Example 14 | a-x (60) a-xiii (40) | B-4 (4) | C-5 (0.1) | D-1 (400) D-3 (400) |
| Example 15 | a-iv (60) a-viii (40) | B-5 (4) | C-5 (0.1) | D-1 (200) D-3 (600) |
| Comparative Example 1 | a-vi (100) | B-4 (4) | C-3 (0.1) | D-1 (400) D-3 (400) |

The acid generators (B), acid diffusion controllers, other additives, and solvents in Table 3 are as follows.

Acid Generator (B)
- B-1: bis(4-t-butylphenyl)iodonium nonafluoro-n-butane-sulfonate
- B-2: bis(4-t-butylphenyl)iodonium 10-camphorsulfonate
- B-3: bis(4-t-butylphenyl)iodoniumtrifluoromethane sulfonate
- B-4: N-(trifluoromethanesulfonyloxy)bicyclo-[2.2.1]hept-5-ene-2,3-dicarboxyimide
- B-5: bis(cyclohexylsulfonyl)diazomethane
- B-6: triphenylsulfoniumtrifluoromethanesulfonate
- B-7: N-(10-camphorsulfonyloxy)succinimide Acid Diffusion Controller
- C-1: tri-n-octylamine
- C-2: triethanolamine
- C-3: 2-phenylpyridine
- C-4: N,N,N',N'-tetrakis(2-hydroxypropyl)ethylenediamine
- C-5: 2-Phenylbenzimidazole
- C-6: t-butoxycarbonyl-2-phenylbenzimidazole Solvent
- D-1: ethyl lactate
- D-2: ethyl 3-ethoxypropionate
- D-3: propylene glycol monomethyl ether acetate
- D-4: 2-heptanone The solutions were filtered through a membrane filter with a pore diameter of 0.2 μm to prepare solution compositions. The solution composition was spin-coated on a silicon wafer. PB was then performed under the conditions shown in Table 4 to form resist coatings with a thickness of 0.5 μm from the compositions of Examples 1–8, Examples 11–15, and Comparative Example 1, and a resist coating with a thickness of 0.1 μm from the composition of Example 9. A resist coating with a thickness of 0.3 μm was formed from the composition of Example 10.

The resist coatings were exposed to radiations using a stepper "NSR2205EX12B" (manufactured by Nikon Corp., numerical aperture: 0.55) in Examples 1–8, Examples 11–15, and Comparative Example 1, an F2 excimer laser exposure apparatus "XLS" (manufactured by Ultratech Corp., numerical aperture: 0.60) in Example 9, and an electron beam lithography system "HL700" (manufactured by Hitachi, Ltd., acceleration voltage: 30 KeV) in which the acceleration voltage was remodeled to 50 KeV in Example 10. PEB was performed under the conditions shown in Table 4. The resist patterns were developed at 23° C. for 1 minute by a paddle method using a 2.38 wt % tetramethylammonium hydroxide aqueous solution. The resist coatings were then washed with purified water and dried to form a resist pattern.

Evaluation of resists was carried out as follows.

Sensitivity:
A resist coating was formed on a silicon wafer, exposed to light, and immediately baked (PEB), followed by alkali development, washing with water, and drying. Sensitivity was evaluated based on an optimum exposure dose capable of forming a 1:1 line and space pattern (1L1S) with a line width of 0.25 μm.

Resolution:
The minimum line and space (1L1S) dimension (μm) resolved by an optimum dose of irradiation was taken as the resolution.

Relative Etching Rate:
A composition solution was applied to a silicon wafer by spin coating and dried to form a resist film with a thickness of 0.5 μm. Then, the resist film was dry-etched using a Pinnacle 8000 (manufactured by PMT Co.) and with $CF_4$, $Cl_2$, and Ar as etching gases at a flow rate of 75 sccm and an output of 2,500 W under a gas pressure of 2.5 mTorr to measure the etching rate. The relative etching rate was evaluated using the ratio of the found value to the etching rate of the film of a cresol novolac resin (Mw=6,500) obtained by bulk polymerization by heating a mixture of 40 parts by weight of p-cresol and 120 parts by weight of 37% formalin aqueous solution at 130° C. for 8 hours. The smaller the etching rate, the better the dry etching resistance.

The results of the evaluation of each resist are shown in Table 4.

TABLE 4

|  | Film thickness (μm) | PB Conditions | Exposure/Light source | PEB Conditions | Resolution (μm) | Sensitivity | Relative etching rate |
|---|---|---|---|---|---|---|---|
| Example 1 | 0.5 | 120°, 90 sec | KrF | 130°, 90 sec | 0.20 | 340 J/m$^2$ | 1.3 |
| Example 2 | 0.5 | 120°, 90 sec | KrF | 130°, 90 sec | 0.21 | 260 J/m$^2$ | 1.3 |
| Example 3 | 0.5 | 100°, 90 sec | KrF | 100°, 90 sec | 0.20 | 360 J/m$^2$ | 1.4 |
| Example 4 | 0.5 | 100°, 90 sec | KrF | 100°, 90 sec | 0.20 | 350 J/m$^2$ | 1.4 |
| Example 5 | 0.5 | 120°, 90 sec | KrF | 130°, 90 sec | 0.20 | 420 J/m$^2$ | 1.3 |
| Example 6 | 0.5 | 120°, 90 sec | KrF | 130°, 90 sec | 0.21 | 440 J/m$^2$ | 1.3 |
| Example 7 | 0.5 | 120°, 90 sec | KrF | 120°, 90 sec | 0.21 | 450 J/m$^2$ | 1.3 |
| Example 8 | 0.5 | 120°, 90 sec | KrF | 130°, 90 sec | 0.20 | 330 J/m$^2$ | 1.3 |
| Example 9 | 0.1 | 120°, 90 sec | F2 | 130°, 90 sec | 0.18 | 260 J/m$^2$ | 1.3 |
| Example 10 | 0.3 | 120°, 90 sec | Electron beams | 130°, 90 sec | 0.18 | 0.1 C/m$^2$ | 1.3 |
| Example 11 | 0.5 | 120°, 90 sec | KrF | 130°, 90 sec | 0.20 | 400 J/m$^2$ | 1.3 |
| Example 12 | 0.5 | 100°, 90 sec | KrF | 100°, 90 sec | 0.20 | 320 J/m$^2$ | 1.3 |
| Example 13 | 0.5 | 120°, 90 sec | KrF | 130°, 90 sec | 0.20 | 340 J/m$^2$ | 1.3 |
| Example 14 | 0.5 | 120°, 90 sec | KrF | 130°, 90 sec | 0.20 | 320 J/m$^2$ | 1.3 |
| Example 15 | 0.5 | 100°, 90 sec | KrF | 100°, 90 sec | 0.20 | 320 J/m$^2$ | 1.3 |
| Comparative Example 1 | 0.5 | 120°, 90 sec | KrF | 130°, 90 sec | 0.22 | 330 J/m$^2$ | 1.4 |

The radiation-sensitive resin composition of the present invention is useful as a chemically amplified resist sensible to active radiations, for example, deep ultraviolet rays represented by a KrF excimer laser, ArF excimer laser, F2 excimer laser, and EUV excimer laser, exhibiting high resolution and high radiation transmittance, without impairing dry etching resistance. The composition is extremely suitable in the field of microfabrication represented by manufacturing of semiconductor devices, which will become more and more minute.

Obviously, numerous modifications and variations of the present invention are possible in light of the above teachings. It is therefore to be understood that, within the scope of the appended claims, the invention may be practiced otherwise than as specifically described herein.

What is claimed is:

1. A copolymer having recurring units of the following formulas (1), (2), and (3),

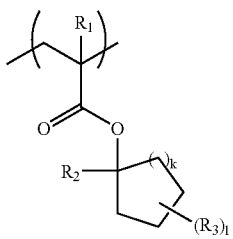
(1)

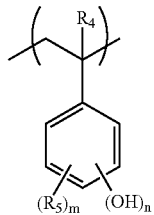
(2)

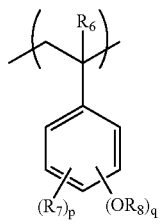
(3)

wherein $R_1$ represents a hydrogen atom, $R_2$ and $R_3$ individually represent a monovalent organic group, k is an integer of 1 or 2, and l is an integer of 0 to 4, wherein $R_4$ represents a hydrogen atom or a methyl group, $R_5$ represents a monovalent organic group, n is an integer of 1 to 3, and m is an integer of 0 to 3, and wherein $R_6$ represents a hydrogen atom or a methyl group, $R_7$ represents a monovalent organic group, $R_8$ indicates a substituted methyl group, 1-substituted ethyl group, 1-branched alkyl group, triorganosilyl group, triorganogermyl group, alkoxycarbonyl group, acyl group, or cyclic acid-dissociable group, with two or more $R_8$ groups being either the same or different, q is an integer of 1 to 3, and p is an integer of 0 to 3, the copolymer having a polystyrene-reduced weight average molecular weight determined by gel permeation chromatography (GPC) of 3,000–100,000.

2. The copolymer according to claim 1, wherein the group $R_8$ in the formula (2) is at least one group selected from the group consisting of a t-butyl group, benzyl group, 1-methoxyethyl group, 1-ethoxyethyl group, trimethylsilyl group, t-butoxycarbonyl group, t-butoxycarbonylmethyl group, tetrahydropyranyl group, tetrahydrofuranyl group, tetrahydrothiopyranyl group, tetrahydrothiofuranyl group, and 2-methyl-2-adamantyl group.

3. A polymer mixture comprising:

(a1) a copolymer having recurring units of the following formulas (1) and (2),

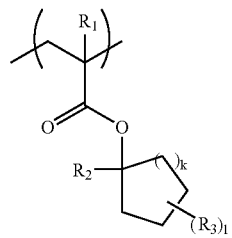
(1)

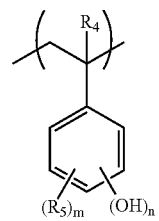
(2)

wherein $R_1$ represents a hydrogen atom, $R_2$ and $R_3$ individually represent a monovalent organic group, k is an integer of 1 or 2, and l is an integer of 0 to 4, wherein $R_4$ represents a hydrogen atom or a methyl group, $R_5$ represents a monovalent organic group, n is an integer of 1 to 3, and m is an integer of 0 to 3, and (a2) a copolymer having the recurring unit of the formula (2) and a recurring unit of the following formula (3),

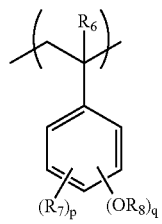
(3)

wherein $R_6$ represents a hydrogen atom or a methyl group, $R_7$ represents a monovalent organic group, $R_8$ indicates a substituted methyl group, 1-methoxy ethyl group, 1-branched alkyl group, triorganosilyl group, triorganogermyl group, t-butoxycarbonylmethyl group, acyl group, or cyclic acid-dissociable group, with two or more $R_8$ groups being either the same or different, q is an integer of 1 to 3, and p is an integer of 0 to 3, wherein the copolymer (a1) further contains the recurring unit of the formula (3).

4. The polymer mixture according to claim 3, wherein the copolymer (a1) or the copolymer (a2) further contains a recurring unit derived from a non-acid-dissociable hydrophobic compound.

5. The polymer mixture according to claim 4, wherein the non-acid-dissociable hydrophobic compound is styrene, α-methylstyrene, 4-methylstyrene, 2-methylstyrene, 3-methylstyrene, or tricyclodecanyl acrylate.

6. The polymer mixture according to claim 3, wherein the group $R_8$ in the formula (2) is at least one group selected from the group consisting of a t-butyl group, benzyl group, 1-methoxyethyl group, trimethylsilyl group, t-butoxycarbonylmethyl group, tetrahydropyranyl group, tetrahydrofuranyl group, tetrahydrothiopyranyl group, tetrahydrothiofuranyl group, and 2-methyl-2-adamantyl group.

7. A radiation-sensitive resin composition comprising:
(A) a copolymer containing recurring units of the following formulas (1), (2), and (3),

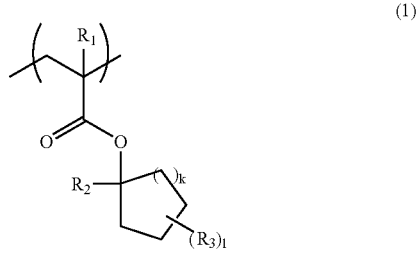

wherein $R_1$ represents a hydrogen atom, $R_2$ and $R_3$ individually represent a monovalent organic group, k is an integer of 1 or 2, and l is an integer of 0 to 4,

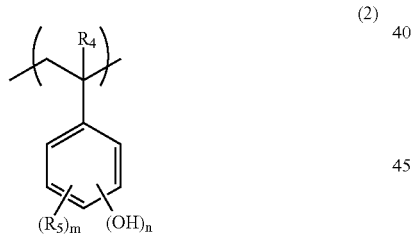

wherein $R_4$ represents a hydrogen atom or a methyl group, $R_5$ represents a monovalent organic group, n is an integer of 1 to 3, and m is an integer of 0 to 3, and

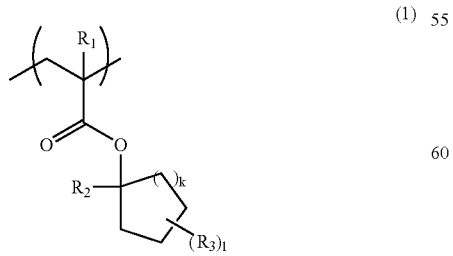

wherein $R_6$ represents a hydrogen atom or a methyl group, $R_7$ represents a monovalent organic group, $R_8$ indicates a substituted methyl group, 1-substituted ethyl group, 1-branched alkyl group, triorganosilyl group, triorganogermyl group, alkoxycarbonyl group, acyl group, or cyclic acid-dissociable group, with two or more $R_8$ groups being either the same or different, q is an integer of 1 to 3, and p is an integer of 0 to 3, and (B) a photoacid generator.

8. The composition according to claim 7, wherein the copolymer (A) has a polystyrene-reduced weight average molecular weight determined by gel permeation chromatography (GPC) of 3,000–100,000.

9. The composition according to claim 7, wherein the copolymer (A) further comprises a recurring unit derived from a non-acid-dissociable hydrophobic compound.

10. The composition according to claim 9, wherein the non-acid-dissociable hydrophobic compound is styrene, α-methylstyrene, 4-methylstyrene, 2-methylstyrene, 3-methylstyrene, or tricyclodecanyl acrylate.

11. The composition according to claim 7, wherein the group $R_8$ in the formula (2) is at least one group selected from the group consisting of a t-butyl group, benzyl group, 1-methoxyethyl group, 1-ethoxyethyl group, trimethylsilyl group, t-butoxycarbonyl group, t-butoxycarbonylmethyl group, tetrahydropyranyl group, tetrahydrofuranyl group, tetrahydrothiopyranyl group, tetrahydrothiofuranyl group, and 2-methyl-2-adamantyl group.

12. The composition according to claim 7, wherein the photoacid generator (B) comprises a sulfonimide compound.

13. The composition according to claim 7, wherein the photoacid generator (B) comprises a disulfonyl diazomethane compound.

14. A copolymer having recurring units of the following formulas (1), (2), and (3),

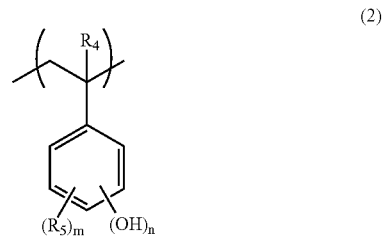

wherein $R_1$ represents a hydrogen atom, $R_2$ and $R_3$ individually represent a monovalent organic group, k is an integer of 1 or 2, and l is an integer of 0 to 4,

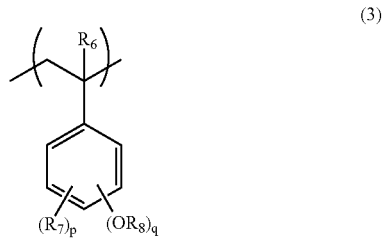

wherein $R_4$ represents a hydrogen atom or a methyl group, $R_5$ represents a monovalent organic group, n is an integer of 1 to 3, and m is an integer of 0 to 3, and

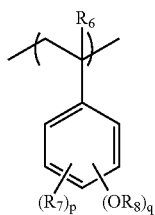

(3)

wherein $R_6$ represents a hydrogen atom or a methyl group, $R_7$ represents a monovalent organic group, each $R_8$ indicates a substituted methyl group, a 1-branched alkyl group, a triorganosilyl group, a triorganogermyl group, an alkoxycarbonyl group, an acyl group, or a cyclic acid-dissociable group, with two or more $R_8$ groups being either the same or different, q is an integer of 1 to 3, and p is an integer of 0 to 3.

15. The copolymer of claim 14, wherein each $R_8$ in the formula (2) is independently selected from the group consisting of a t-butyl group, a benzyl group, a trimethylsilyl group, a t-butoxycarbonyl group, a t-butoxycarbonylmethyl group, a tetrahydropyranyl group, a tetrahydrofuranyl group, a tetrahydrothiopyranyl group, a tetrahydrothiofuranyl group, and a 2-methyl-2-adamantyl group.

16. A radiation-sensitive resin composition comprising:
(A) a polymer component comprising a copolymer (a1) having recurring units of the following formulas (1), (2) and (3),

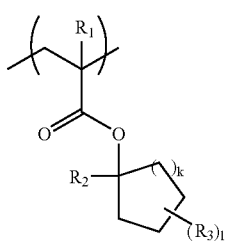

(1)

wherein $R_1$ represents a hydrogen atom, $R_2$ and $R_3$ individually represent a monovalent organic group, k is an integer of 1 or 2, and l is an integer of 0 to 4,

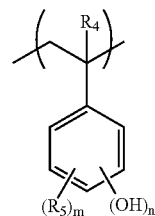

(2)

wherein $R_4$ represents a hydrogen atom or a methyl group, $R_5$ represents a monovalent organic group, n is an integer of 1 to 3, and m is an integer of 0 to 3, and

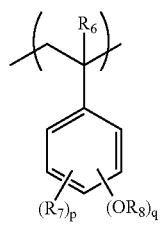

(3)

wherein $R_6$ represents a hydrogen atom or a methyl group, $R_7$ represents a monovalent organic group, $R_8$ indicates a substituted methyl group, 1-methoxy ethyl group, 1-branched alkyl group, triorganosilyl group, triorganogermyl group, t-butoxycarbonylmethyl group, acyl group, or cyclic acid-dissociable group, with two or more $R_8$ groups being either the same or different, q is an integer of 1 to 3, and p is an integer of 0 to 3, and a copolymer (a2) having a recurring unit of the above formula (2) and a recurring unit of the above formula (3), and (B) a photoacid generator.

* * * * *